(12) United States Patent
Suzuki

(10) Patent No.: US 8,484,546 B2
(45) Date of Patent: Jul. 9, 2013

(54) INFORMATION PROCESSING APPARATUS, INFORMATION TRANSMITTING METHOD, AND INFORMATION RECEIVING METHOD

(75) Inventor: Takeshi Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 309 days.

(21) Appl. No.: 13/005,354

(22) Filed: Jan. 12, 2011

(65) Prior Publication Data

US 2011/0191648 A1 Aug. 4, 2011

(30) Foreign Application Priority Data

Feb. 1, 2010 (JP) .................................. 2010-020480

(51) Int. Cl.
*G06F 11/00* (2006.01)
(52) U.S. Cl.
USPC ........................................................ 714/807
(58) Field of Classification Search
USPC ..... 714/746, 758, 799, 800–801, 807; 341/51
See application file for complete search history.

(56) References Cited

U.S. PATENT DOCUMENTS 6,721,918 B2 * 4/2004 Self et al. ...................... 714/800
8,117,526 B2 * 2/2012 Skerlj ............................ 714/807

FOREIGN PATENT DOCUMENTS

| JP | 2002-26741 A | 1/2002 |
| JP | 2007-526574 A | 9/2007 |
| JP | 2008-541059 A | 11/2008 |
| WO | WO-2005/088467 | 9/2005 |
| WO | WO-2006/121882 | 11/2006 |

* cited by examiner

*Primary Examiner* — Shelly A Chase
(74) *Attorney, Agent, or Firm* — Fujitsu Patent Center

(57) ABSTRACT

A transmitting-side device is connected with a receiving-side device via a parallel bus that carries transmit data and an error-correcting code based on this transmit data in parallel. The transmitting-side device includes a signal inversion unit for inverting a signal to be sent to the parallel bus. The receiving-side device includes a signal inversion unit for inverting a received signal from the parallel bus, and an error detection unit for performing error detection and error correction based on a signal output from the signal inversion unit. The signal inversion unit inverts a signal to be sent to all bus lines of the parallel bus and the signal inversion unit inverts the signal received from the all bus lines, which enables the error detection unit to perform error check on the parallel bus.

12 Claims, 21 Drawing Sheets

INFORMATION PROCESSING APPARATUS, INFORMATION TRANSMITTING METHOD, AND INFORMATION RECEIVING METHOD

CROSS-REFERENCE TO RELATED APPLICATION

This application is based upon and claims the benefits of priority of the prior Japanese Patent Application No. 2010-020480, filed on Feb. 1, 2010, the entire contents of which are incorporated herein by reference.

FIELD

The embodiments discussed herein are related to an information processing apparatus, information transmitting method, and information receiving method.

BACKGROUND

Information processing apparatus such as server, which is expected to be highly reliable, may use an ECC (Error-Correcting Code) in data transmission over a connection bus with another information processing apparatus or between internal devices of the own apparatus. A bus used for data transmission using an ECC is called "ECC bus", which enables a receiving side of data to perform single-bit error detection and correction, and double-bit error detection.

To check an ECC bus for an error, one example technique is to expressly change transmit data with a dedicated program or hardware device, and confirm whether the data is received without fail at a receiving side. For example, there are two methods for this technique. One method is to send a pattern having changed bits and compare this pattern with an expected pattern at a receiving side during error checking time. However, the error check according this method may not be performed simultaneously with error detection using ECC. The other method is to send transmit data while changing the values of its bits a little at a time (for example, one bit by one bit) and confirm whether the data is received without fail at a receiving side. However, this method needs to prepare patterns of such transmit data as to obtain different ECC patterns.

Another technique to check an ECC bus for an error is to invert only one bit of a signal on a data part or ECC part of a bus, send the signal to the bus, and confirm that an error is detected at a receiving side. FIG. 21 illustrates an example configuration of a system to which this technique is implemented.

FIG. 21 is an example configuration of information processing apparatuses provided with a bus error checking function. In the illustrated configuration, information processing apparatuses are connected to each other with an ECC bus. A transmitting apparatus 910 that is an information processing apparatus of signal transmitting side includes a bus arbitration circuit 911, an inversion control circuit 912, a bus inversion circuit 913, an output circuit 914, and an error detection circuit 915.

The bus arbitration circuit 911 is connected to internal circuits with a plurality of buses. The bus arbitration circuit 911 selects one of transmit signals received from these buses, and outputs the selected transmit signal to the bus inversion circuit 913. The inversion control circuit 912 instructs the bus inversion circuit 913 which bit of a signal is to be inverted. The bus inversion circuit 913 inverts the specified bit of the transmit signal received from the bus arbitration circuit 911, as instructed by the inversion control circuit 912. The output circuit 914 sends the signal received from the bus inversion circuit 913 to a receiving apparatus 920 over the ECC bus. The error detection circuit 915 detects an error in the signal input to the output circuit 914.

On the other hand, the receiving apparatus 920 that is an information processing apparatus of signal receiving side includes an inversion control circuit 921, a bus inversion circuit 922, a receiving circuit 923, and an error detection circuit 924.

The inversion control circuit 921 instructs the bus inversion circuit 922 which bit of a signal is to be inverted. The bus inversion circuit 922 inverts the specified bit of a signal received from the transmitting apparatus 910, as instructed by the inversion control circuit 921. The receiving circuit 923 outputs the signal received from the bus inversion circuit 922 to internal circuits of the receiving apparatus 920. The error detection circuit 924 performs error detection and correction on the signal input to the receiving circuit 923.

To check the ECC bus connecting the transmitting apparatus 910 and the receiving apparatus 920 for an error, either one of the bus inversion circuit 913 of the transmitting apparatus 910 and the bus inversion circuit 922 of the receiving apparatus 920 inverts one bit of a signal. If the ECC bus has not failed, the error detection circuit 924 of the receiving apparatus 920 detects a single-bit error. If the ECC bus has failed, however, the error detection circuit 924 does not detect any errors or detects a double-bit error.

A double-bit error, which is detected by the error detection circuit 924, indicates that an error has occurred in a bus line different from the one which carried an inverted bit of a signal. If a double-bit error is detected, the error detection circuit 924 is not capable of correcting the received signal. This error checking technique may cause a correction failure error accordingly. Therefore, this error check may not be performed during the normal system operation.

By the way, there is a technique for error correction using bit inversion, in which a plurality of syndrome data corresponding to respective single-bit errors of received data are stored, data obtained by inverting one bit of actually received data is compared with the data based on the stored syndrome, and positions for three-bit error correction are located.

Further, there is a technique for data transmission test using bit inversion, in which a BIST (Built In Self Test) circuit is used to selectively invert a plurality of test data, a test data value sequence obtained by logically combining the resulting data is output, and then it is confirmed whether the sequence agrees with an expected value.

Still further, there is a system for transmitting data with a dual encoding technique, in which ground bounce is suppressed by inverting and transmitting data if the number of bits changed from previous data is greater than a prescribed value.

For example, please refer to Japanese Laid-open Patent Publication No. 2002-26741, and Japanese National Publications of International Patent Applications Nos. 2008-541059 and 2007-526574.

The above-described ECC bus error checking techniques have a common problem that the error check may not be performed during the normal system operation because special data for error check need to be prepared and sent in advance or because there is a possibility of detection of uncorrectable double-bit errors.

SUMMARY

According to an aspect of the invention, an information processing apparatus that transmits signals including transmit data and an error-correcting code generated based on the transmit data to a receiving-side device in parallel via a parallel bus having plural bus lines includes a signal inversion unit that inverts at least portion of the signals to be sent to the receiving-side device through bus lines of the parallel bus.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
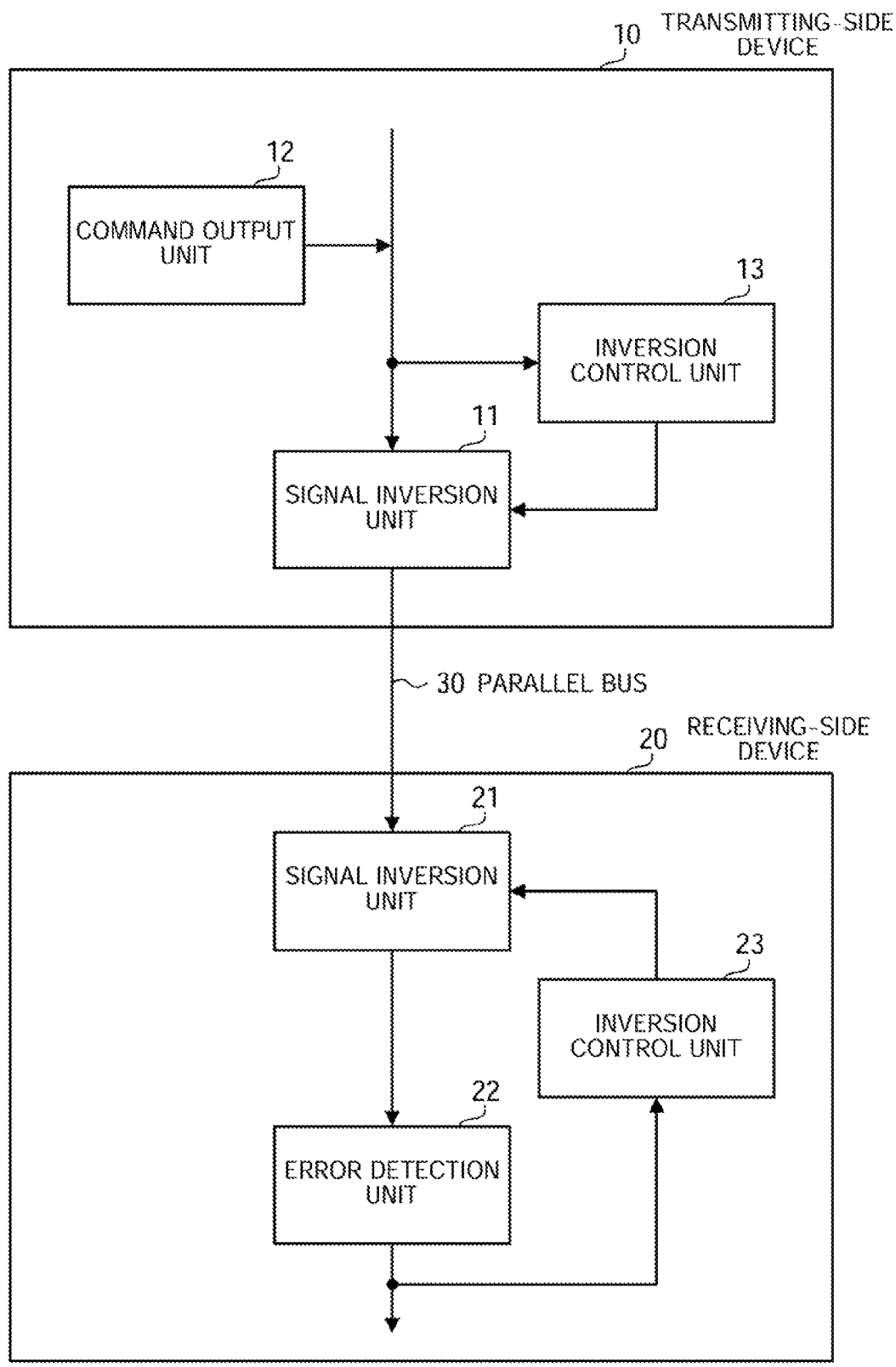
FIG. 1 illustrates a configuration of an information transmission system according to a first embodiment.

Embodiments of the present invention will now be described with reference to the accompanying drawings, wherein like reference numerals refer to like elements throughout.

First Embodiment

FIG. 1 illustrates a configuration of an information transmission system according to a first embodiment.

In the illustrated information transmission system, a transmitting-side device 10 and a receiving-side device 20 are connected to each other with a parallel bus 30. The transmitting and receiving-side devices 10 and 20 are bus interfaces that connect internal devices within an information processing apparatus, for example. Assuming that the parallel bus 30 is a bus that connects information processing apparatuses to each other, the transmitting and receiving-side devices 10 and 20 serve as bus interface circuits that are provided in the transmitting-side and receiving-side information processing apparatuses, respectively.

The parallel bus 30 carries transmit data and an error-correcting code generated based on this transmit data, in parallel. Thereby, the receiving side on the parallel bus 30 is capable of performing error detection and error correction on a received signal. For example, the parallel bus 30 of this embodiment enables error detection for up to two bits and single-bit error correction.

The transmitting-side device 10 has a signal inversion unit 11 for inverting a signal to be sent to all bus lines of the parallel bus 30. The receiving-side device 20, on the other hand, has a signal inversion unit 21 for inverting a received signal from all bus lines of the parallel bus 30 and an error detection unit 22 for performing error detection and error correction on a signal received from the signal inversion unit 21.

According to the above configuration, the transmitting-side signal inversion unit 11 inverts a transmit signal to be sent to all bus lines, and the receiving-side signal inversion unit 21 inverts the signal received from the all bus lines again, which enables the error detection unit 22 to check the parallel bus 30 for an error. If one bus line of the parallel bus 30 has failed, the error detection unit 22 detects a single-bit error based on the signal received from the faulty bus line.

For example, an original low-level transmit signal is inverted to high level by the signal inversion unit 11, and is sent to the parallel bus 30. However, if a bus line of the parallel bus 30 has failed, the signal on the faulty bus line becomes a low level. The receiving-side signal inversion unit 21 receives and inverts the low-level signal from the faulty bus line, and outputs the generated high-level signal to the error detection unit 22. Therefore, the error detection unit 22 determines the received signal to be an error. According to this operation, even if an original signal on a faulty bus line remains at the same low level because the faulty bus line is not used for signal transmission, for example, the error of the bus line is detected.

In addition, in this bus error check, failure of one bus line does not lead to detecting a two- or more-bit error at the error detection unit 22 because only a signal received from the faulty bus line has an erroneous value. When detecting a single-bit error, the error detection unit 22 is capable of correcting the error. Therefore, the failure of one bus line does not interrupt information transmission from the transmitting-side device 10 to the receiving-side device 20 even while the error check takes place. Therefore, a dedicated time period may not be prepared for performing the error check, and it is possible to perform the error check and normal information transmission simultaneously.

By the way, the transmitting-side device 10 may further be provided with a command output unit 12 and an inversion control unit 13. The receiving-side device 20 may further be provided with an inversion control unit 23 that enables the signal inversion unit 21 to switching its operation between enabling and disabling inversion of a signal received from the bus.

The command output unit 12 generates an inversion command for instructing the receiving-side device 20 to invert a signal received from all bus lines of the parallel bus 30 and sends this command to the receiving-side device 20 via the parallel bus 30. At this time, the command output unit 12 also generates an error-correcting code based on the inversion command and sends these inversion command and error-correcting code together to the receiving-side device 20. An output signal of the command output unit 12 is sent to the parallel bus 30 via the signal inversion unit 11.

The inversion control unit 13 controls based on the inversion command from the command output unit 12 whether to invert a signal at the signal inversion unit 11. More specifically, when the inversion control unit 13 detects an inversion command from an output signal that is output from the command output unit 12 to the signal inversion unit 11, the inversion control unit 13 instructs the signal inversion unit 11 to invert and transmit a signal to be sent to all bus lines. The inversion control unit 13 causes the signal inversion unit 11 to start the signal inversion operation after the detected inversion command is output from the signal inversion unit 11 to the parallel bus 30.

In the receiving-side device 20, on the other hand, when detecting the inversion command from an error-corrected signal received from the error detection unit 22, the inversion control unit 23 instructs the signal inversion unit 21 to invert a signal received from the all bus lines. The inversion control unit 23 causes the signal inversion unit 21 to start the signal inversion operation at least after the detected inversion command is output from the signal inversion unit 21.

As described above, by transmitting an inversion command over the parallel bus 30, the receiving-side device 20 is caused to start the signal inversion operation as instructed by the transmitting-side device 10. In addition, under the control of the inversion control unit 13, the transmitting-side device 10 is also caused to start the signal inversion operation according to the inversion command. This means that it is possible to start the above-described bus error check operation in response to the inversion command, especially at desired timing.

Further, by the command output unit 12 outputting an inversion disable command for disabling inversion of a signal on the bus, the inversion control units 13 and 23 are caused to detect this inversion disable command and instruct their signal inversion units 11 and 21 to disable their inversion operation. Therefore, it is possible to use this inversion disable command to complete the above-described bus error check operation.

The following describes an example system in which error check is performed on a parallel bus connecting information processing apparatuses.

Second Embodiment

Figure 2:
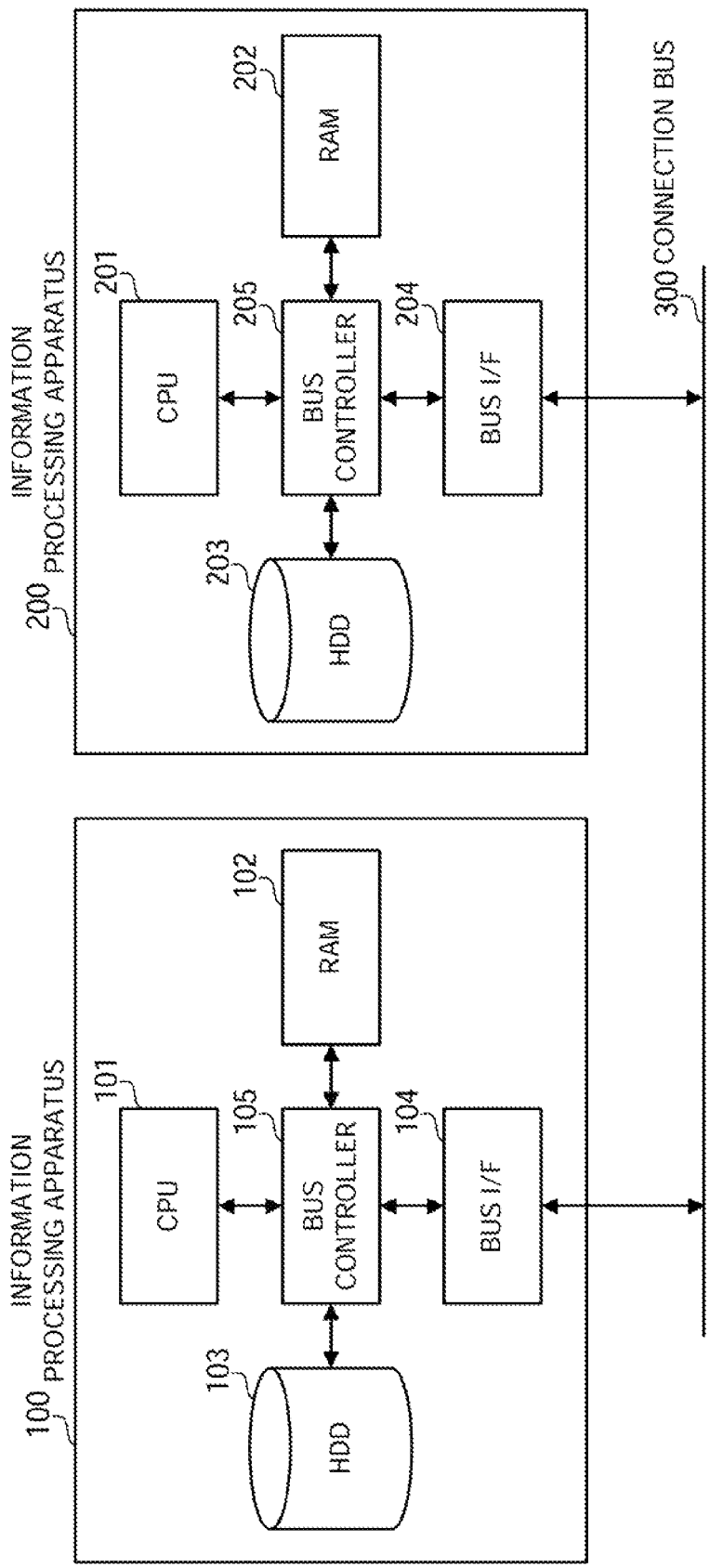
FIG. 2 illustrates a configuration of an information transmission system according to a second embodiment.

FIG. 2 illustrates a configuration of an information transmission system according to a second embodiment.

The illustrated information transmission system is a system in which data is communicated between information processing apparatuses 100 and 200 over a connection bus 300 that is a parallel bus. Each information processing apparatus 100 and 200 is a computer that operates by a CPU executing programs. The connection bus 300 is an ECC bus that carries transmit data and ECC based on this transmit data in parallel.

The information processing apparatus 100 includes a CPU (Central Processing Unit) 101, a RAM (Random Access Memory) 102, an HDD (Hard Disk Drive) 103, a bus interface (I/F) 104, and a bus controller 105.

The CPU 101 executes various programs stored in memory media such as the HDD 103 in order to entirely control the information processing apparatus 100. The RAM 102 temporarily stores part of programs to be executed by the CPU 101 and various data necessary for the CPU 101 to execute the programs. The HDD 103 stores the programs to be executed by the CPU 101 and various data for executing the programs.

The bus I/F 104 is an interface circuit for communicating data with an external apparatus such as the information processing apparatus 200 over the connection bus 300. The bus I/F 104 has an error checking function for the connection bus 300 as will be described later. This error checking function includes a function of inverting all bits of a signal to be sent to the connection bus 300, a function of inverting all bits of a received signal from the connection bus 300, and a function of performing error detection and error correction on the inverted received signal.

The bus controller 105 controls data communication between the CPU 101 and RAM 102 and between the HDD 103 and bus I/F 104. The bus controller 105 communicates data with the bus I/F 104 via the ECC bus that carries transmit data and ECC in parallel. The bus controller 105 also has a function of calculating an ECC based on data to be transferred from the CPU 101 to the bus I/F 104, and a function of performing error detection and error correction based on a received signal from a bus I/F 204.

The information processing apparatus 200 is a computer having the same hardware configuration as the information processing apparatus 100. The information processing apparatus 200 includes a CPU 201, a RAM 202, an HDD 203, the bus I/F 204, and a bus controller 205, which correspond to the CPU 101, RAM 102, HDD 103, bus I/F 104, and bus controller 105 of the information processing apparatus 100, respectively.

Figure 3:
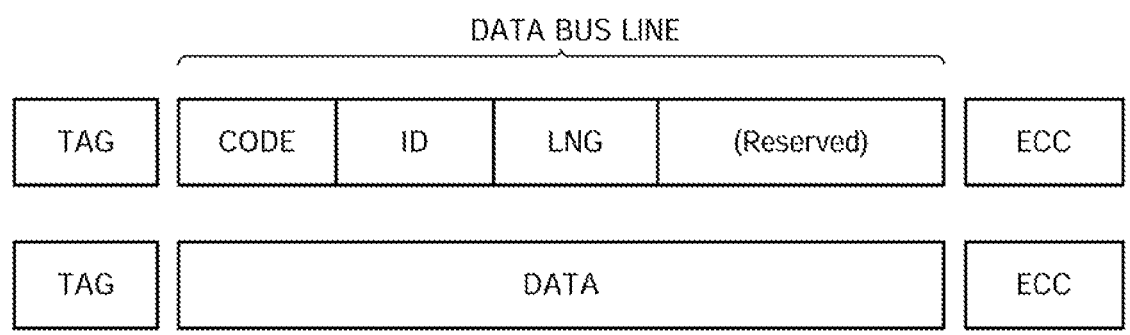
FIG. 3 illustrates an example structure of a packet that is transmitted over a connection bus.

FIG. 3 illustrates an example structure of a packet that is transmitted over a connection bus.

Referring to FIG. 3, data arranged in a horizontal direction is sent to the connection bus 300 in parallel in one clock cycle. More specifically, in this embodiment, the connection bus 300 includes bus lines for carrying "TAG", "ECC", and other data.

"TAG" indicates whether information to be transmitted over the data bus lines is valid or invalid. "TAG" of "00" or "11" indicates that the data bus lines are invalid. "TAG" of "01" indicates that the data bus lines are valid and are to carry packet structure data. "TAG" of "10" indicates that the data bus lines are valid and are to carry actual data "DATA".

"ECC" is an error-correcting code that is calculated based on a "TAG" value and values to be carried by the data bus lines. This error-correcting code enables double-bit error detection and single-bit error correction, and is a humming code, for example.

On the data bus lines, the header of a packet includes packet structure data as header information as illustrated at the upper part of FIG. 3. Then, actual data "DATA" for one or more clock cycles follows the packet structure data as illustrated at the lower part of FIG. 3. That is, a packet include the packet structure data and subsequently actual data. FIG. 3 illustrates an example in which "DATA" is transmitted in one clock cycle. The packet structure data includes "CODE", "ID", "LNG", and other data.

"CODE" is a control code indicating the attribute of a packet. In this embodiment, a packet with "CODE" of a hexadecimal value other than "FF" is referred to as a "general packet". In addition, a packet with "CODE" of "FF" is referred to as a "bus control packet".

"ID" is a serial number of the packet. "LNG" indicates the data length of the packet. In this embodiment, this "LNG" is represented by the number of clock cycles. Data bus lines other than those used for "CODE", "ID", "LNG" are "Reserved" as options.

Figure 4:
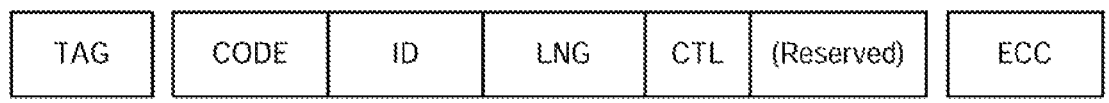
FIG. 4 illustrates an example structure of a bus control packet.

FIG. 4 illustrates an example structure of a bus control packet.

For example, a bus control packet is transmitted in one clock cycle, and includes the above-described "CODE", "ID", "LNG", and "Reserved". More specifically, "CODE" has a hexadecimal value of "FF", and "CTL" is stored in a part of the "Reserved" area. In this embodiment, "CTL" is one-bit bus inversion data, in which a value of "1" indicates that all bits in the subsequent packets are inverted, whereas a value of "0" indicates that no bits in the subsequent packets are inverted.

In the system configuration illustrated in FIG. 2, a bus control packet is generated in a transmitting-side one of the bus I/Fs 104 and 204, and is sent to the connection bus 300. After transmitting a bus control packet with "CTL" of "1", a transmitting-side bus I/F sends the subsequent packets to the connection bus 300 after inverting all bits thereof. In addition, by transmitting the bus control packet to the receiving-side bus I/F, the receiving-side bus I/F is notified that the subsequent packets have all bits inverted. The notified receiving-side bus I/F inverts all bits of the subsequently received packets, and performs error detection based on the inverted signal. After the bus control packet is transmitted, the receiving-side bus I/F performs the bus error check while the information processing apparatuses 100 and 200 communicate data.

In this embodiment, a bus control packet is transmitted in one clock cycle, for example. In this case, a bus control packet has "LNG" of "1". Alternatively, a bus control packet may be transmitted in two or more clock cycles. In this case, "LNG" of the bus control packet is set to the number of clock cycles consumed for the transmission of the bus control packet.

The following describes the functions that each bus I/F 104 and 204 has for performing the bus error check during data transmission, assuming that data is transmitted from the information processing apparatus 100 to the information processing apparatus 200 over the connection bus 300.

Figure 5:
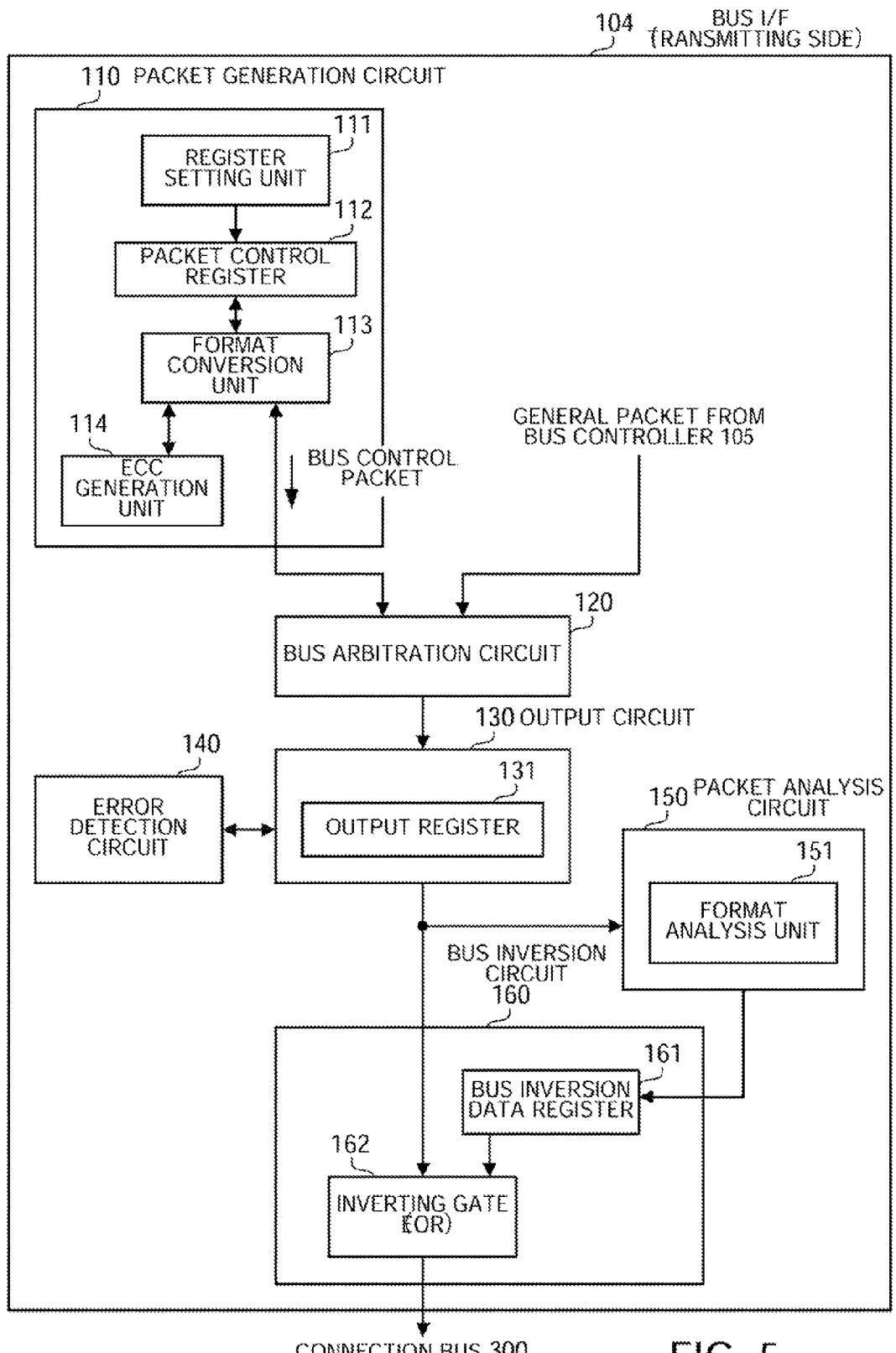
FIG. 5 illustrates an internal configuration of a transmitting-side bus I/F.

FIG. 5 illustrates an internal configuration of a transmitting-side bus I/F.

The bus I/F 104 of the information processing apparatus 100 includes a packet generation circuit 110, a bus arbitration circuit 120, an output circuit 130, an error detection circuit 140, a packet analysis circuit 150, and a bus inversion circuit 160.

The packet generation circuit 110 generates and outputs an above-described bus control packet to the bus arbitration circuit 120. The packet generation circuit 110 includes a register setting unit 111, a packet control register 112, a format conversion unit 113, and an ECC generation unit 114.

Figure 6:
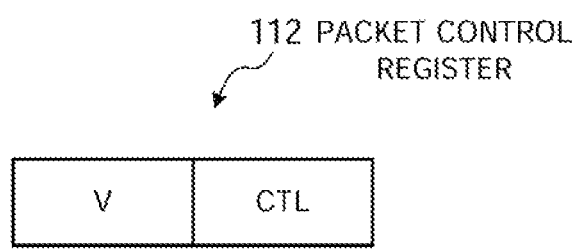
FIG. 6 illustrates example data set in a packet control register.

FIG. 6 illustrates data set in a packet control register.

The illustrated packet control register 112 contains "V" and "CTL" each of which is one-bit data. "V" indicates whether to generate a bus control packet, in which "V" is set to "0" if there is no need to generate a bus control packet, and "V" is set to "1" when generation of a bus control packet is requested. "CTL" indicates whether to invert all bits on the connection bus 300, in which "CTL" is set to "1" if all bits are to be inverted, and "CTL" is set to "0" if there is no need to invert any bits. "CTL" of a bus control packet to be output is set to have the "CTL" value of the packet control register 112.

Referring back to FIG. 5, the register setting unit 111 updates the packet control register 112 with, for example, values entered by an administrator using the information processing apparatus 100. In order to generate a bus control packet, the register setting unit 111 sets "V" to "1" and also "CTL" to either "0" or "1" in the packet control register 112. Alternatively, the register setting unit 111 may update the packet control register 112 with values given from another information processing apparatus connected to the information processing apparatus 100 via the connection bus 300 or another communication line, for example.

When "V" of the packet control register 112 turns to "1", the format conversion unit 113 prepares values to generate a bus control packet with the values, and then requests the bus arbitration circuit 120 to transmit the bus control packet. The format conversion unit 113 sets "TAG" of the generated bus control packet to "01" and also sets "CTL" of the bus control packet to have the "CTL" value of the packet control register 112. Further, the format conversion unit 113 notifies the ECC generation unit 114 of the "TAG" value and the values to be sent to the data bus lines, to request generation of an error-correcting code.

The ECC generation unit 114 calculates an error-correcting code based on the values received from the format conversion unit 113, and returns this error-correcting code to the format conversion unit 113. The format conversion unit 113 sets "ECC" of the bus control packet to the received error-correcting code. When receiving a transmission acceptance signal from the bus arbitration circuit 120, the format conversion unit 113 gives the bus control packet to the bus arbitration circuit 120, and updates "V" of the packet control register 112 to "0".

The bus arbitration circuit 120 receives packets from a plurality of devices connected to the input side thereof, and supplies these packets to the output circuit 130. In this embodiment, the bus arbitration circuit 120 selectively outputs a general packet requested to be transmitted by the bus controller 105 and the bus control packet requested to be transmitted by the packet generation circuit 110 to the output circuit 130.

The output circuit 130 includes an output register 131 for storing a signal received from the bus arbitration circuit 120 in the output register 131 once and outputting it to the packet analysis circuit 150 and bus inversion circuit 160. In addition, the output circuit 130 transfers the received signal to the error detection circuit 140.

The error detection circuit 140 performs error detection for up to two bits based on the signal received from the output circuit 130. If a single-bit error is detected, the error detection circuit 140 performs error correction, and returns the error-corrected data to the output circuit 130. The error-corrected data is placed in the output register 131, and then output. If a double-bit error is detected, on the other hand, the error detection circuit 140 notifies the CPU 101 of the information processing apparatus 100 of a correction failure error in order to stop the communication between the bus controller 105 and the bus I/F 104.

The packet analysis circuit 150 determines based on the contents of a packet received from the output circuit 130 whether bus inversion has been instructed or not. The packet analysis circuit 150 includes a format analysis unit 151 for analyzing the packet. Upon receipt of a bus control packet from the output circuit 130, the packet analysis circuit 150 outputs the "CTL" value of the received packet as a bus inversion signal to the bus inversion circuit 160.

The bus inversion circuit 160 inverts the polarity of all bits of a signal received from the output circuit 130, as necessary, according to the bus inversion signal received from the packet analysis circuit 150. The bus inversion circuit 160 includes a bus inversion data register 161 and inverting gate 162.

The bus inversion data register 161 stores the value of a bus inversion signal received from the format analysis unit 151 of the packet analysis circuit 150. The inverting gate 162 is a gate circuit that performs the EOR (Exclusive OR) operation of a signal output from the output circuit 130 to each bus line and the value stored in the bus inversion data register 161. When the bus inversion data register 161 has a value of "0", the inverting gate 162 transfers an output signal from the output circuit 130 to the connection bus 300 as it is. When the bus inversion data register 161 has a value of "1", on the contrary, the inverting gate 162 inverts the output signal from the output circuit 130 on all bus lines, and sends the inverted signal to the connection bus 300.

By the way, the bus I/F 204 of the information processing apparatus 200 may be provided with the functions of the bus I/F 104 illustrated in FIG. 5, as well.

Figure 7:
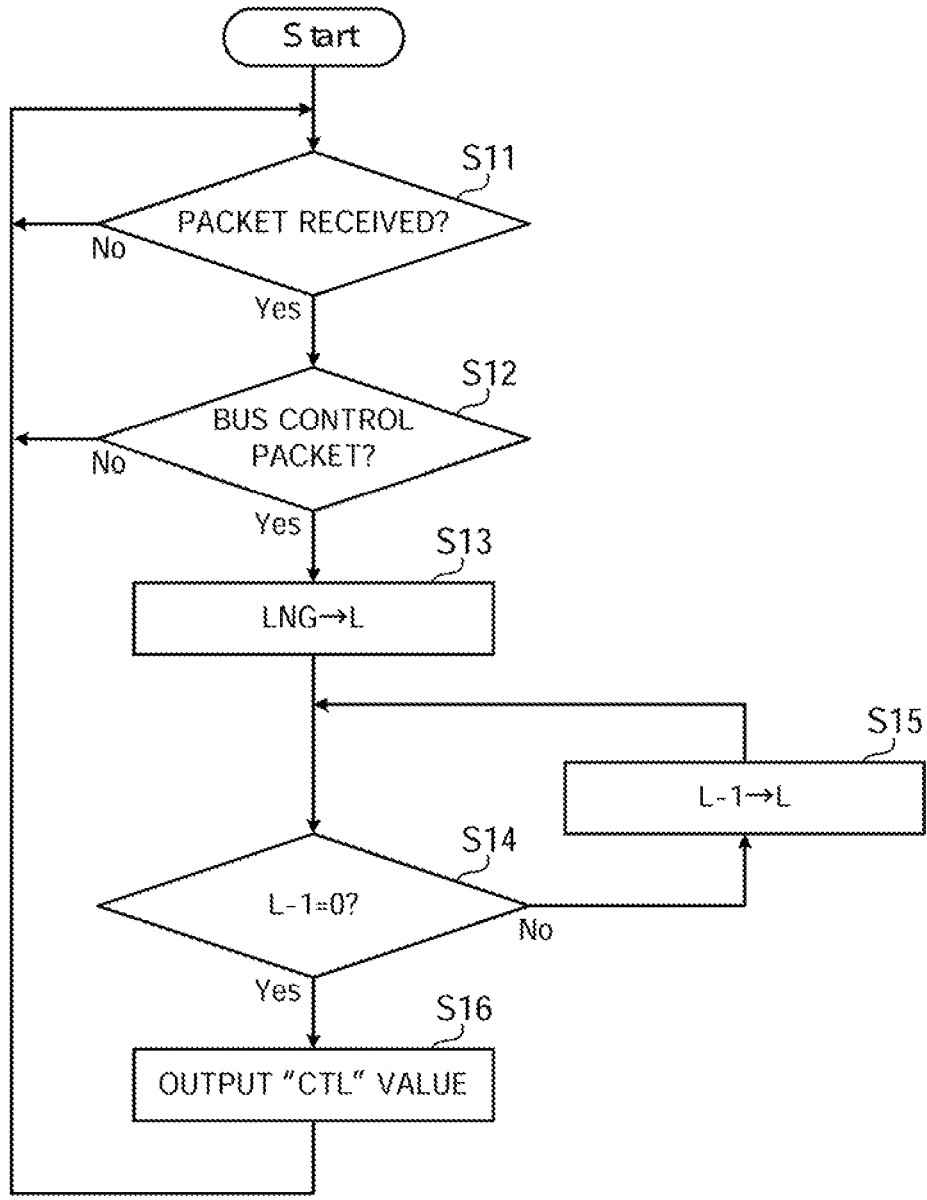
FIG. 7 is a flowchart of how a packet analysis circuit operates.

FIG. 7 is a flowchart of how a packet analysis circuit operates.

(Step S11) The format analysis unit 151 of the packet analysis circuit 150 waits for a packet to be output from the output circuit 130, and when receiving a packet, proceeds to next step S12.

(Step S12) The format analysis unit 151 analyzes the received packet to determine whether this packet is a bus control packet or not. When the received packet has "TAG" of "01", and "CODE" of "FF", the format analysis unit 151 identifies the received packet as a bus control packet, and then proceeds to step S13. If the received packet is not a bus control packet, on the contrary, the format analysis unit 151 returns back to step S11.

(Step S13) The format analysis unit 151 extracts the "LNG" value from the received bus control packet, and sets it as a variable L. In this connection, the "LNG" value is expected to be received in the first clock cycle in the case where it takes a plurality of clock cycles to receive the bus control packet.

(Step S14) The format analysis unit 151 determines whether the end of the bus control packet has been received or not. If decrement of the variable L by one results in zero, then the format analysis unit 151 determines that the end of the bus control packet has been received, and proceeds to step S16. Otherwise, the format analysis unit 151 proceeds to step S15.

(Step S15) The format analysis unit 151 decrements the variable L by one, and then executes step S14 again in the next clock cycle.

In this connection, if a bus control packet is transmitted in one clock cycle, step S15 is not practically executed. In this case, the format analysis unit 151 executes step 16 after step 13, skipping step S14.

(Step S16) The format analysis unit 151 outputs the "CTL" value of the bus control packet as a bus inversion signal to the bus inversion circuit 160 which then updates the bus inversion data register 161 to have the "CTL" value received from the format analysis unit 151 in the next clock cycle. Then, the format analysis unit 151 returns back to step S11 to wait for a next packet.

According to the above processing, the bus inversion data register 161 is updated based on a bus control packet only after this bus control packet is output from the inverting gate 162 of the bus inversion circuit 160. Then, when a packet next to the bus control packet is input to the inverting gate 162, the stored value of the bus inversion data register 161 is updated, and the inverting gate 162 switches its operation between enabling and disabling the inversion accordingly.

Figure 8:
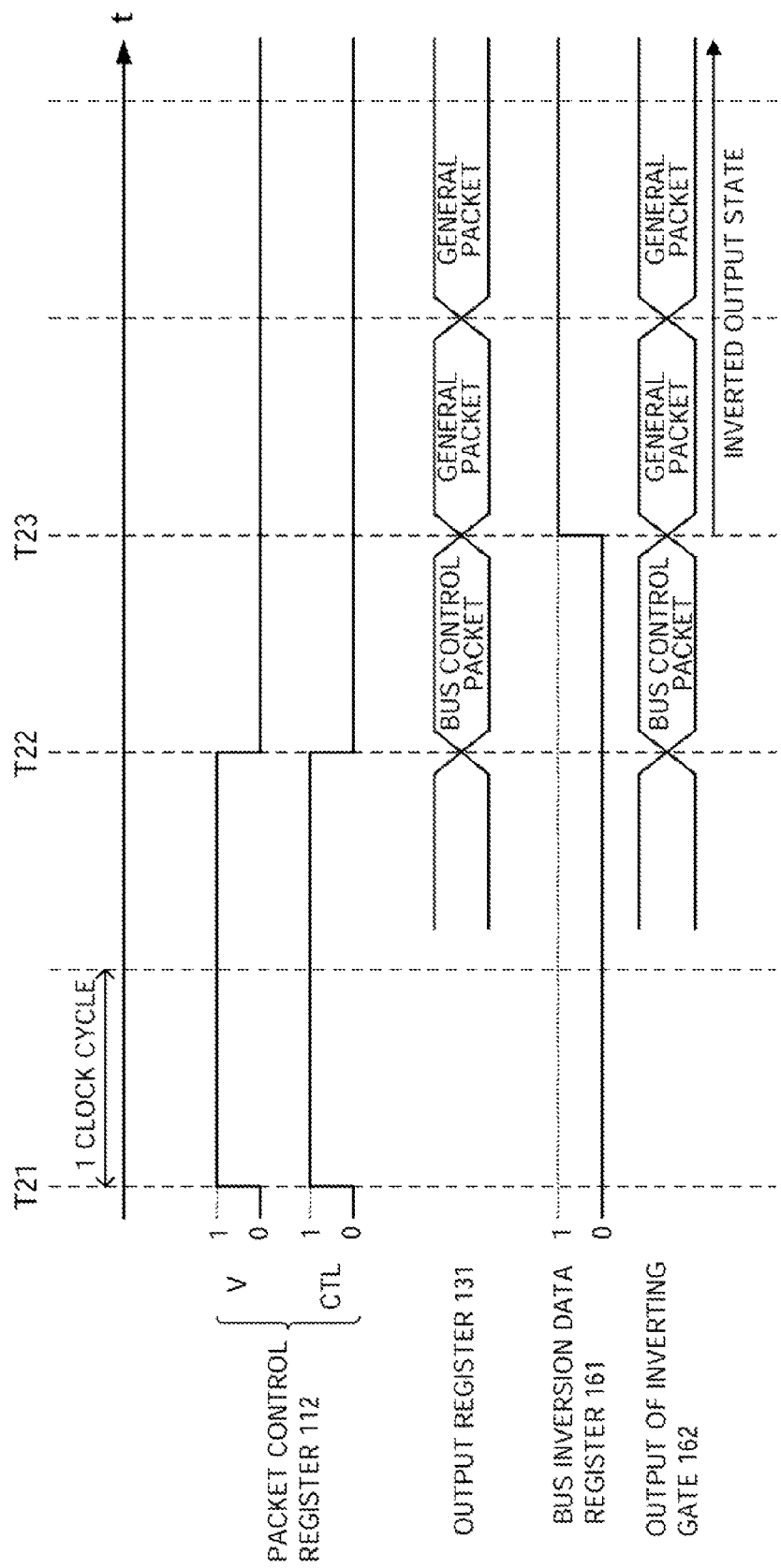
FIG. 8 is a time chart illustrating an example operation of the transmitting-side bus I/F.

FIG. 8 is a time chart illustrating an example operation of a transmitting-side bus I/F. The following describes how the bus I/F 104 operates from a situation where the inverting gate 162 of the bus inversion circuit 160 does not perform inversion to a situation where the inverting gate 162 starts the inversion.

First, the register setting unit 111 sets both "V" and "CTL" of the packet control register 112 to "1" (timing T21). Detecting that "V" of the packet control register 112 turns to "1", the format conversion unit 113 generates a bus control packet and requests the bus arbitration circuit 120 to transmit this bus control packet. At this time, the generated bus control packet has "CTL" of "1", which is the same value as "CTL" of the packet control register 112.

The bus arbitration circuit 120 transmits a transmission acceptance signal to the format conversion unit 113, and places the bus control packet received from the format conversion unit 113 in the output register 131 of the output circuit 130 (timing T22). At this time, the format conversion unit 113, having received the transmission acceptance signal, updates the "V" value of the packet control register 112 to "0". In this connection, it is assumed that the bus control packet is transmitted in one clock cycle.

Referring to the example of FIG. 8, the format conversion unit 113 updates "CTL" as well as "V" to "0" in the packet control register 112. However, the "CTL" may not be set to "0" at timing T22 because the "CTL" is updated to a desired value when "V" is set to "1".

The bus control packet placed in the output register 131 is output to the packet analysis circuit 150 and bus inversion circuit 160. The bus inversion data register 161 of the bus inversion circuit 160 has a value of "0", so that the inverting gate 162 transmits the bus control packet received from the output register 131 to the connection bus 300 as it is.

Upon receipt of the bus control packet having "CTL" of "1", the format analysis unit 151 of the packet analysis circuit 150 instructs the bus inversion circuit 160 to update the value of the bus inversion data to "1", as described with reference to the flowchart of FIG. 7, thereby updating the stored value of the bus inversion data register 161 to "1" in the next clock cycle (timing T23). After this timing, the inverting gate 162 inverts all bits of the signal received from the output register 131, and sends the inverted signal to the connection bus 300.

To disable the inversion operation of the inverting gate 162, the following process is performed. First, the register setting unit 111 sets "V" and "CTL" of the packet control register 112 to "1" and "0", respectively. When detecting that "V" of the packet control register 112 turns to "1", the format conversion unit 113 generates a bus control packet having "CTL" of "0", and requests the bus arbitration circuit 120 to transmit this bus control packet.

When the bus arbitration circuit 120 places the bus control packet having "CTL" of "0" in the output register 131, the format analysis unit 151 of the packet analysis circuit 150 updates the bus inversion data register 161 to have a value of "0", which is the same value as "CTL" of the received bus control packet, in the clock cycle next to the one in which the bus control packet was transmitted. In this connection, the bus control packet having "CTL" of "0" is sent to the connection bus 300 with all bits inverted by the inverting gate 162. After the value of the bus inversion data register 161 is updated to "0", the inverting gate 162 sends the signal of subsequently received packets to the connection bus 300 as it is, without any bits inverted.

Figure 9:
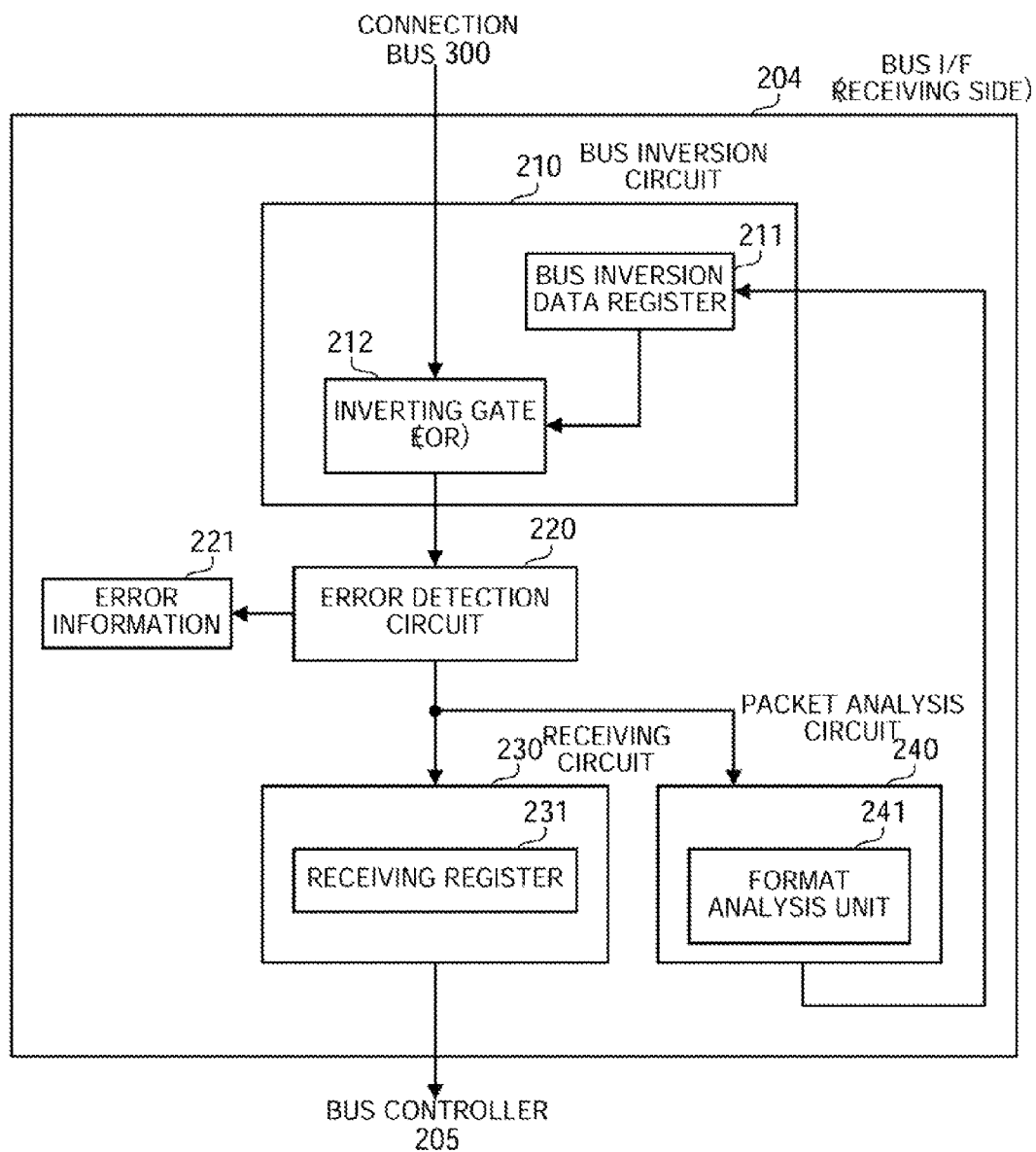
FIG. 9 illustrates an example internal configuration of a receiving-side bus I/F.

FIG. 9 illustrates an example internal configuration of a receiving-side bus I/F.

The bus I/F 204 of the information processing apparatus 200 includes a bus inversion circuit 210, an error detection circuit 220, a receiving circuit 230, and a packet analysis circuit 240.

The bus inversion circuit 210 inverts the polarity of a signal received from all bus lines of the connection bus 300, as necessary, according to a bus inversion signal from the packet analysis circuit 240. The bus inversion circuit 210 includes a bus inversion data register 211 and an inverting gate 212.

The bus inversion data register 211 stores the value of a bus inversion signal received from the packet analysis circuit 240. The inverting gate 212 is a gate circuit that performs the EOR operation of a received signal from the connection bus 300 and a stored value of the bus inversion data register 211. When the bus inversion data register 211 has a value of "0", the inverting gate 212 outputs the received signal from the connection bus 300 to the receiving circuit 230 as it is. On the other hand, when the bus inversion data register 211 has a value of "1", the inverting gate 212 inverts the received signal from all bus lines of the connection bus 300, and then outputs it to the receiving circuit 230. The value "1" of the bus inversion data register 211 means that the bus error check is being performed.

The error detection circuit 220 performs error detection for up to two bits based on a signal output from the inverting gate 212, that is, "TAG" value, values on data bus lines, and "ECC" value. In addition, if a single-bit error is detected, the error detection circuit 220 performs error correction.

If a single-bit error is detected during the bus error check (for example, while the bus inversion data register 211 has a value of "1"), the error detection circuit 220 generates error information 221 describing that one bus line of the connection bus 300 has failed. This error information 221 is stored in a nonvolatile memory medium such as the HDD 203, for example. The contents of the error information 221 may be provided to an administrator via a display device (not illustrated) or another device connected to the information processing apparatus 200.

On the other hand, if a double-bit error is detected, the error detection circuit 220 notifies the CPU 201 of the information processing apparatus 200 of a correction failure error in order to stop the communication between the bus controller 205 and the bus I/F 204.

The receiving circuit 230 includes a receiving register 231 for storing a signal of one clock cycle received from the error detection circuit 220 in the receiving register 231 once and then outputting it to the bus controller 205 of the information processing apparatus 200.

The packet analysis circuit 240 determines based on the contents of the packet received from the error detection circuit 220 whether the bus inversion has been instructed or not. The packet analysis circuit 240 includes a format analysis unit 241 for analyzing a packet. Upon receipt of a bus control packet from the error detection circuit 220, the packet analysis circuit 240 updates the bus inversion data register 211 of the bus inversion circuit 210 to have the "CTL" value of the received packet as a bus inversion signal.

The receiving circuit 230 may be arranged on the input side of the bus inversion circuit 210, for example, as long as the error detection circuit 220 is capable of performing error detection and error correction based on an output signal of the bus inversion circuit 210.

In addition, the bus I/F 104 of the information processing apparatus 100 may be provided with the above-described functions of the bus I/F 204 illustrated in FIG. 9.

Figure 10:
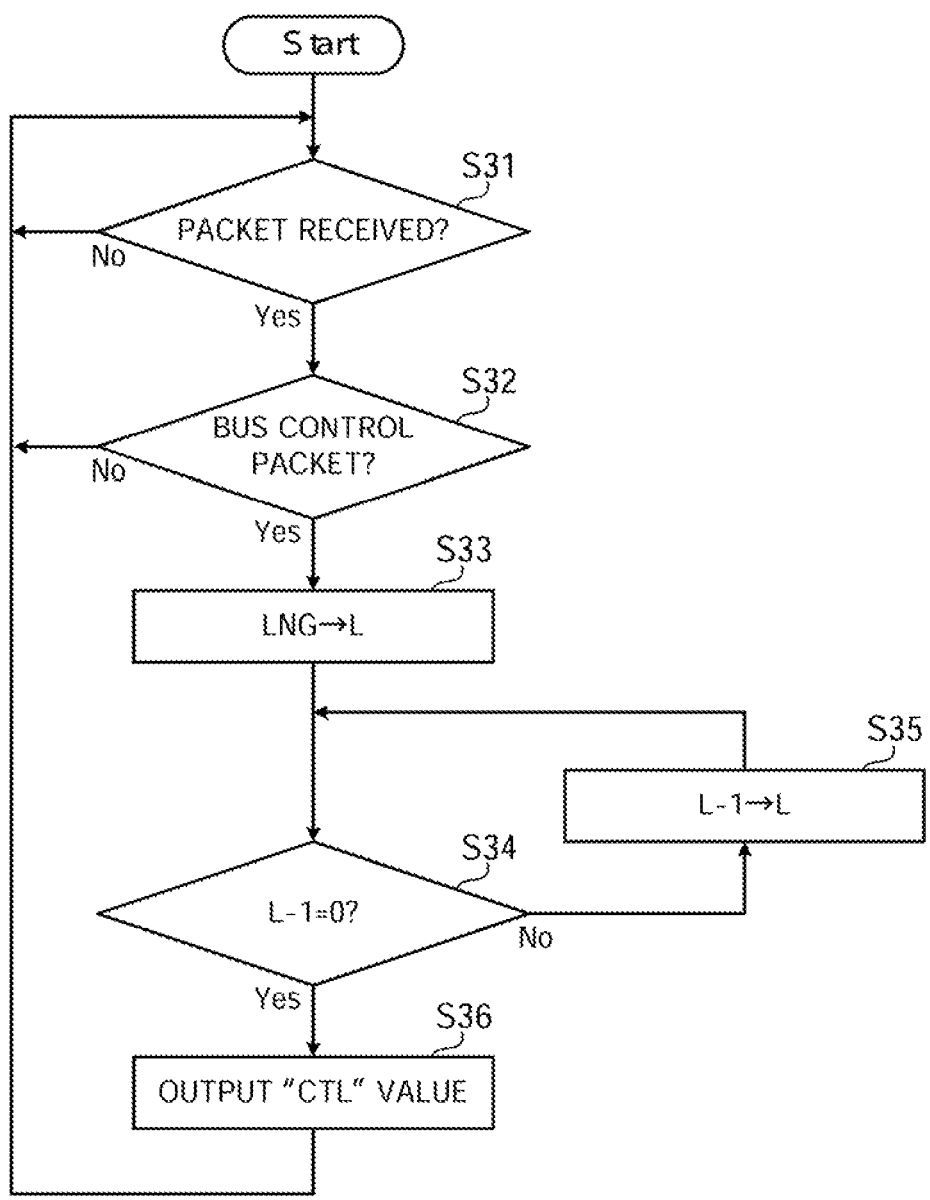
FIG. 10 is a flowchart of how a packet analysis circuit operates.

FIG. 10 is a flowchart of how a packet analysis circuit operates.

(Step S31) The format analysis unit 241 of the packet analysis circuit 240 waits for a packet to be output from the error detection circuit 220, and when receiving a packet, proceeds to next step S32.

(Step S32) The format analysis unit 241 analyzes the received packet to determine whether the received packet is a bus control packet or not. The format analysis unit 241 identifies the packet as a bus control packet when the packet has "TAG" of "01" and "CODE" of "FF", and then proceeds to step S33. If the packet is not a bus control packet, on the contrary, the format analysis unit 241 returns back to step S31.

(Step S33) The format analysis unit 241 extracts the "LNG" value from the received bus control packet and sets it as a variable L. In this connection, the "LNG" value is expected to be received in the first clock cycle if it takes a plurality of clock cycles to receive the bus control packet.

(Step S34) The format analysis unit 241 determines whether the end of the bus control packet has been received or not. If decrement of the variable L by one results in zero, the format analysis unit 241 determines that the end of the bus control packet has been received, and then proceeds to step S36. Otherwise, the format analysis unit 241 proceeds to step S35.

(Step S35) The format analysis unit 241 decrements the variable L by one, and then executes step S34 again in the next clock cycle.

Similarly to the processing of the transmitting side, step S35 is skipped in the case where a bus control packet is transmitted in one clock cycle, so that step S36 follows step S33.

(Step S36) The format analysis unit 241 sends the "CTL" value of the bus control packet as a bus inversion signal to the bus inversion circuit 210, which causes the bus inversion circuit 210 to update the bus inversion data register 211 to have the received "CTL" value in the next clock cycle. Then, the format analysis unit 241 returns back to step S31 to wait for a next packet.

According to the above processing, the bus inversion data register 211 is updated based on a bus control packet only after this bus control packet passes through the inverting gate 212 of the bus inversion circuit 210. Then, when a packet following the bus control packet is input to the inverting gate 212, the value of the bus inversion data register 211 is updated, and the inverting gate 212 switches its operation between enabling and disabling the inversion accordingly.

Figure 11:
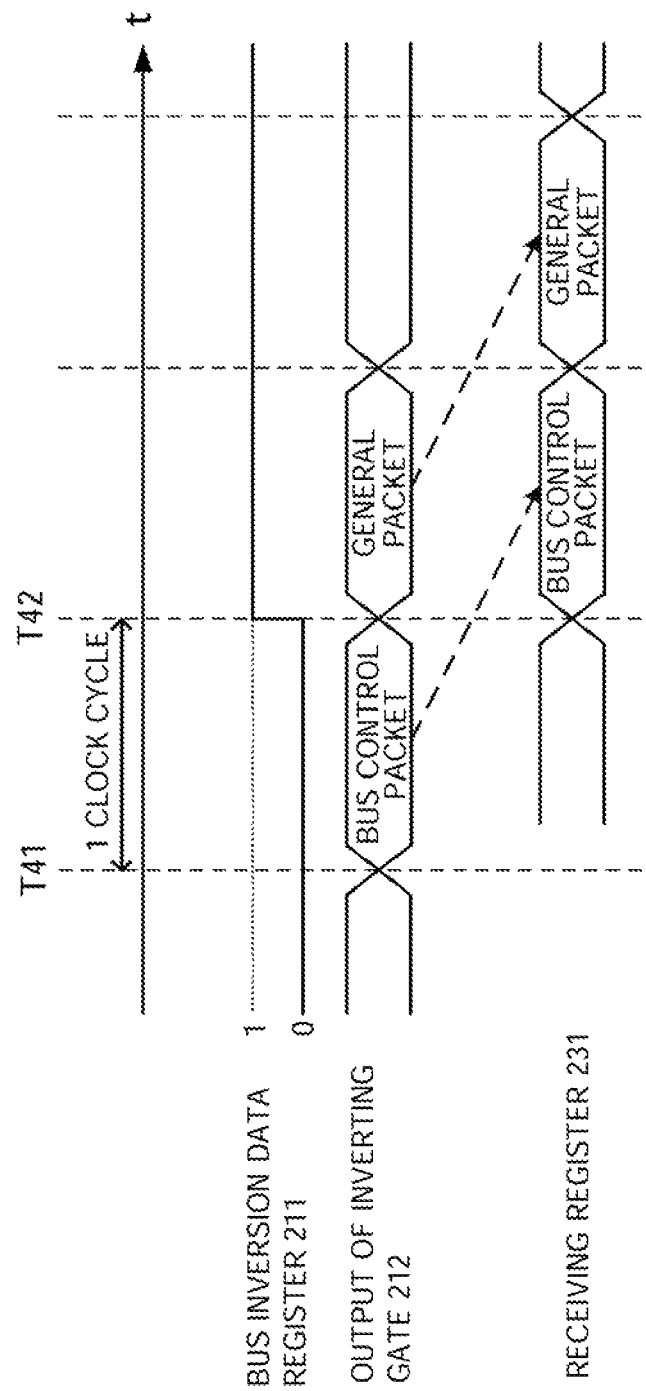
FIG. 11 is a time chart illustrating an example operation of the receiving-side bus I/F.

FIG. 11 is a time chart illustrating an example operation of a receiving-side bus I/F. The following describes how the bus I/F 204 operates from a situation where the inverting gate 212 of the bus inversion circuit 210 does not perform inversion to a situation where the inverting gate 212 starts the inversion.

When the bus inversion data register 211 has a value of "0", the inverting gate 212 outputs a received signal from the connection bus 300 to the error detection circuit 220 as it is, without the signal inverted. When a bus control packet arrives from the connection bus 300 in this situation, this bus control packet passes through the inverting gate 212 and error detection circuit 220 to the receiving circuit 230 and packet analysis circuit 240 (timing T41).

Upon receipt of the bus control packet having "CTL" of "1", the format analysis unit 241 of the packet analysis circuit 240 instructs the bus inversion circuit 210 to update the value of the bus inversion data to "1", as described with reference to the flowchart of FIG. 10, thereby updating the stored value of the bus inversion data register 211 to "1" in the next clock cycle (timing T42).

After this timing, the signal input to the bus inversion circuit 210 from all bus lines of the connection bus 300 is an inverted version of an original signal. Then, the inverting gate 212 inverts the signal received from the all bus lines of the connection bus 300, and outputs the inverted signal through the error detection circuit 220 to the receiving circuit 230 and packet analysis circuit 240. This enables the receiving circuit 230 and packet analysis circuit 240 to receive the signal having the original bit values even when the received signal from the connection bus 300 is an inverted version of the original signal.

If one bus line of the connection bus 300 has failed in the situation where an inverted version of an original signal is transmitted over the connection bus 300, the error detection circuit 220 detects a single-bit error.

For example, when a value of an original transmit signal on one bus line is "0", a signal having its inverted value "1" is sent to this bus line. If the bus line has failed, the bus I/F 204 recognizes the received signal from the faulty bus line to have a value of "0", and then a value "1" obtained by inverting this received value is input to the error detection circuit 220. Therefore, the error detection circuit 220 determines the received value of the signal from the faulty bus line to be an error. According to this judgment, even if an original signal sent to a faulty bus line remains the same as "0" during the error check because, for example, the faulty bus line is not used for signal transmission, an error in the bus line is detected.

In addition, the error detection circuit 220 identifies a faulty bus line and describes it in the error information 221, and performs error correction and outputs the error-corrected received signal to the receiving circuit 230 and packet analysis circuit 240. Therefore, even if one bus line of the connection bus 300 has failed, the bus I/F 204 is capable of keeping on the normal signal transmission by performing error correction, and identifying the faulty bus line.

In this connection, in the bus I/F 204, when a bus control packet having "CTL" of "0" is outputted from the inverting gate 212 that is currently performing the inversion, the format analysis unit 241 updates the stored value of the bus inversion data register 211 to "0". In response to this updating, the inverting gate 212 disables the inversion operation after the bus control packet with all bits inverted is received, thereby outputting the subsequently received signal to the error detection circuit 220 as it is, without the signal inverted.

In the above-described second embodiment, the transmitting-side bus I/F 104 is provided with a function of inverting a signal to be sent to all bus lines of the connection bus 300. In addition, the receiving-side bus I/F 204 is provided with a function of inverting a received signal from the all bus lines and a function of performing error detection and error correction on the inverted received signal. By sending an inverted version of an original signal to the connection bus 300, it becomes possible to detect an error in one bus line of the connection bus 300 while the normal signal transmission takes place.

In addition, it is possible to perform the bus error check simultaneously with the normal signal transmission. Therefore, dedicated transmit data for the error check may not be prepared, which eliminates the need of providing another hardware device for generating such transmit data on a transmitting side.

Further, by transmitting a bus control packet from a transmitting-side bus I/F 104, it becomes possible to execute the bus error check during a desired period of time. In addition, using a bus control packet eliminates the need of providing a dedicated communication line for making a notice of start of the bus error check operation. Thus, this embodiment is realized with minimized change in system configuration.

Third Embodiment

A system of the third embodiment provides a function of inverting only a signal for a specified bus line in a signal to be sent to the connection bus 300, in addition to the functions of the information transmission system of the second embodiment.

Figure 12:
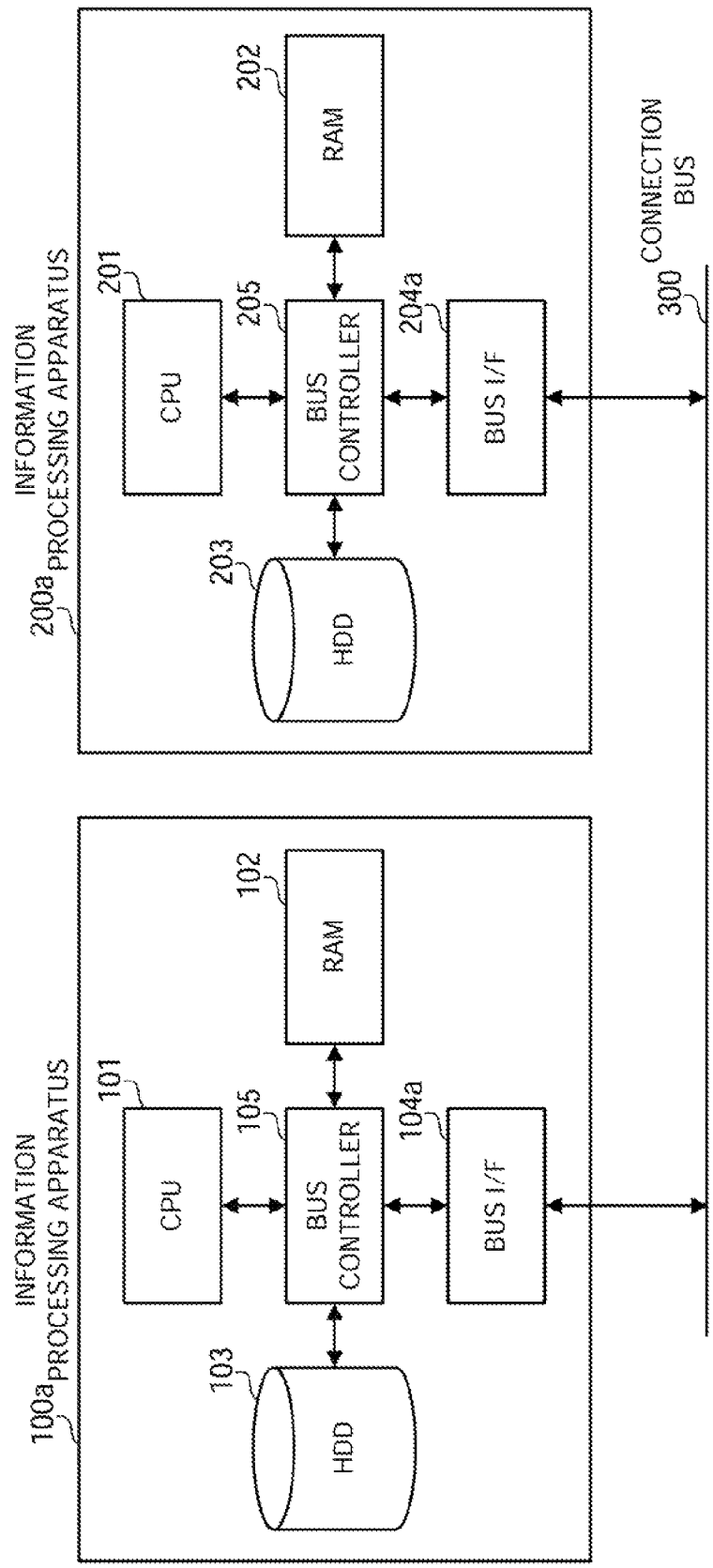
FIG. 12 illustrates a configuration of an information transmission system according to a third embodiment.

FIG. 12 illustrates a configuration of an information transmission system according to the third embodiment. The same reference numerals are used in FIG. 12 as in FIG. 2 for corresponding components, and their explanation will be omitted.

The illustrated information transmission system of this embodiment is a system in which data is communicated between information processing apparatuses 100a and 200a over a connection bus 300. These information processing apparatuses 100a and 200a have basically the same configuration as the information processing apparatuses 100a and 200 of the second embodiment.

Different features from the second embodiment are that, as a transmitting-side apparatus, a bus I/F 104a of the information processing apparatus 100a is provided with a function of inverting only a signal to be sent to a predetermined bus line of the connection bus 300, in addition to the function of inverting a signal to be sent to all bus lines of the connection bus 300. Further, as a receiving-side apparatus, a bus I/F 204a of the information processing apparatus 200a is provided with a function of inverting only a signal of a predetermined bus line in a received signal from the connection bus 300, in addition to the function of inverting a received signal from all bus lines of the connection bus 300. Furthermore, it is also possible to cause only either one of a receiving-side apparatus and a transmitting-side apparatus to execute the signal inversion operation on the bus.

A general packet to be transmitted over the connection bus 300 has the structure illustrated in FIG. 3. This embodiment also uses a bus control packet for controlling the signal inversion operation on the connection bus 300. The bus control packet is generated by a transmitting-side circuit out of the bus I/Fs 104a and 204a, and is sent to the connection bus 300.

Figure 13:
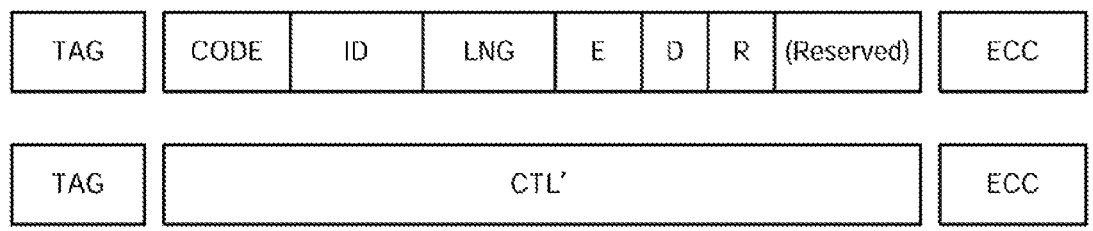
FIG. 13 illustrates an example structure of a bus control packet to be used in the third embodiment.

FIG. 13 illustrates an example structure of a bus control packet to be used in the third embodiment.

In this embodiment, assume that one bus control packet is transmitted in two clock cycles. In the first clock cycle, data bus lines carry "CODE", "ID", "LNG", "E", "D", and "R" as illustrated in the upper part of FIG. 13. Then, in the second clock cycle, the data bus lines carry "CTL'" as illustrated in the lower part of FIG. 13.

Similarly to the second embodiment, "CODE" indicates the attribute of a packet, "ID" is a serial number of the packet, and "LNG" indicates the length of the packet.

"E" is two-bit information that specifies which set of bus lines is intended to carry an inverted signal. "E" of "00" specifies that the data bus lines are intended to carry an inverted signal. "E" of "01" specifies that the bus lines for "TAG" and "ECC" are intended to carry an inverted signal. In addition, "E" of "1x (x is 0 or 1)" indicates that all bus lines are intended to carry an inverted signal.

"D" is one-bit information specifying whether to perform the signal inversion at a transmitting-side apparatus. "D" of "0" indicates no need of the signal inversion at the transmitting-side apparatus, whereas "D" of "1" indicates that the signal inversion is to be performed at the transmitting-side apparatus. "R" is one-bit information specifying whether to perform the signal inversion at a receiving-side apparatus. "R" of "0" indicates no need of the signal inversion at the receiving-side apparatus, whereas "R" of "1" indicates that the signal inversion is to be performed at the receiving-side apparatus. Setting "D" and "R" makes it possible to independently instruct the receiving-side apparatus and the transmitting-side apparatus whether to perform the signal inversion, which realizes the bus error check in various patterns.

"CTL'" is information specifying which bus line is intended to carry an inverted signal. Referring to the example of FIG. 13, "CTL'" has as many bits as there are data bus lines, and a bit corresponding to a bus line intended to carry an inverted signal is set to "1". A bus line intended to carry an inverted signal is specified by a combination of "E" and "CTL'". In the case of "E" of "00", the bits of "CTL'" correspond to the respective data bus lines, and a bit of "CTL'" corresponding to a data bus line intended to carry an inverted signal is set to "1". In the case of "E" of "01", lower-order bits of "CTL'" correspond to the respective bus lines for "TAG" and "ECC", and a bit of "CTL'" corresponding to a bus line intended to carry an inverted signal is set to "1". In the case of "E" of "1x", "CTL'" has all bits of either "0" or "1". The former case indicates an instruction not to invert a signal on any bus lines, whereas the latter case indicates an instruction to invert a signal on all bus lines.

The following describes the functions of the bus I/F 104a and 204a for performing the bus error check while data transmission takes place, assuming that data is transmitted from the information processing apparatus 100a to the information processing apparatus 200a over the connection bus 300.

Figure 14:
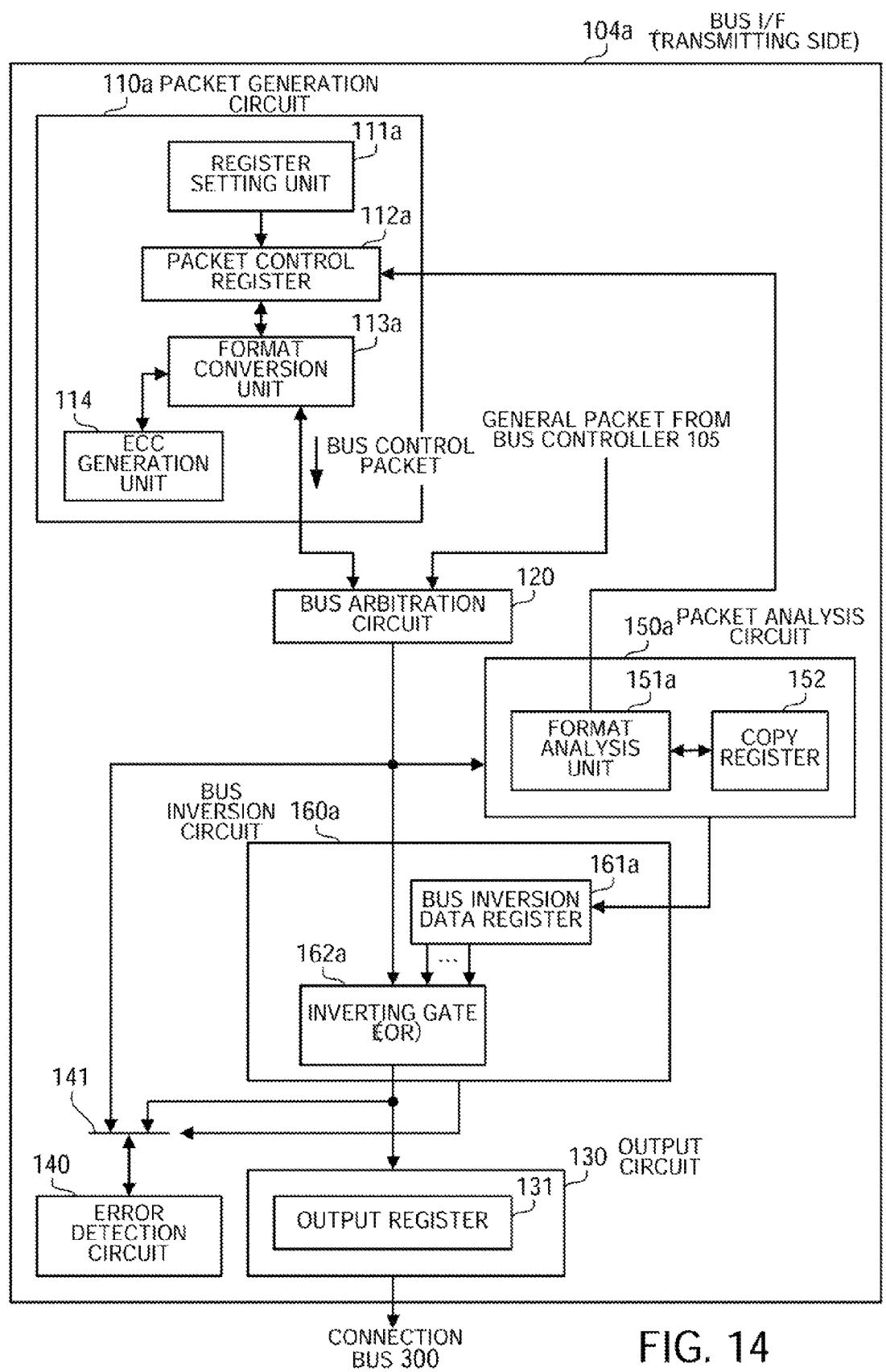
FIG. 14 illustrates an internal configuration of a transmitting-side bus I/F.

FIG. 14 illustrates an internal configuration of a transmitting-side bus I/F. The same reference numerals are used in FIG. 14 as in FIG. 5 for corresponding components.

The bus I/F 104a of the information processing apparatus 100a includes a packet generation circuit 110a, a bus arbitration circuit 120, an output circuit 130, an error detection circuit 140, a selector 141, a packet analysis circuit 150a, and a bus inversion circuit 160a.

The packet generation circuit 110a generates and outputs a bus control packet of FIG. 13 to the bus arbitration circuit 120. The packet generation circuit 110a includes a register setting unit 111a, a packet control register 112a, a format conversion unit 113a, and an ECC generation unit 114.

Figure 15:
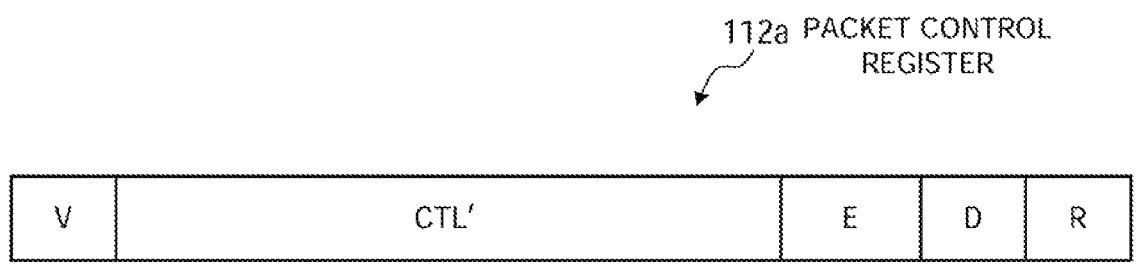
FIG. 15 illustrates example data set in a packet control register.

FIG. 15 illustrates data set in a packet control register.

The packet control register 112a has data for "V", "CTL'", "E", "D", and "R". Similarly to the second embodiment, "V" is information indicating whether to generate a bus control packet, in which "V" is set to "0" if there is no need to generate a bus control packet, and "V" is set to "1" when generation of a bus control packet is requested.

"CTL'" is information that specifies which bus line is intended to carry an inverted signal. "E" is two-bit information that specifies which set of bus lines is intended to carry an inverted signal. "D" is one-bit data that specifies whether to perform the signal inversion at a transmitting-side apparatus. "R" is one-bit data that specifies whether to perform the signal inversion at a receiving-side apparatus. "CTL'", "E", "D", and "R" of a bus control packet to be output are set to have the "CTL'", "E", "D", and "R" values of the packet control register 112a, respectively.

Referring back to FIG. 14, the register setting unit 111a updates the packet control register 112a with, for example, values entered by an administrator using the information processing apparatus 100a. In order to generate a bus control packet, the register setting unit 111a sets "V" of the packet control register 112a to "1", which leads to instructing transmission of the bus control packet. By the register setting unit 111a setting "CTL'", "E", "D", and "R" of the packet control register 112a to desired values, it becomes possible to specify which device is caused to perform the signal inversion on which bus line.

When "V" of the packet control register 112a turns to "1", the format conversion unit 113a prepares values to generate a bus control packet with the values, and requests the bus arbitration circuit 120 to transmit the bus control packet. The format conversion unit 113a sets "TAG" of the bus control packet for two clock cycles to "01", and then sets "CTL'", "E", "D", and "R" of the bus control packet to have the "CTL'", "E", "D", and "R" values of the packet control register 112a, respectively. In addition, the format conversion unit 113a notifies the ECC generation unit 114 of the "TAG" value for each clock cycle and the values to be sent to the data bus lines in order to request the ECC generation unit 114 to generate an error-correcting code.

Based on the values given from the format conversion unit 113a, the ECC generation unit 114 calculates an error-correcting code and returns it back to the format conversion unit 113a. The format conversion unit 113a sets "ECC" of the bus control packet to the received error-correcting code. Upon receipt of a transmission acceptance signal from the bus arbitration circuit 120, the format conversion unit 113a sends the bus control packet.

The bus arbitration circuit 120 selectively outputs a general packet requested to be transmitted by the bus controller 105 and the bus control packet requested to be transmitted by the bus generation circuit 110a. An output signal of the bus arbitration circuit 120 is given to the selector 141, packet analysis circuit 150a, and bus inversion circuit 160a.

The packet analysis circuit 150a controls the signal inversion operation of the bus inversion circuit 160a based on the contents of the packet received from the bus arbitration circuit 120. The packet analysis circuit 150a includes a format analysis unit 151a for analyzing the packet, and a copy register 152 for temporarily storing data extracted from a bus control packet.

If the bus control packet received from the bus arbitration circuit 120 has "D" of "1", the format analysis unit 151a gives the bus inversion circuit 160a a bus inversion signal specifying which bus line is intended to carry an inverted signal, on the basis of the "E" and "CTL'" values. The bus inversion signal has as many bits as there are the bus lines of the connection bus 300, for example. The bits of the bus inversion signal correspond to the respective bus lines, and a bit corresponding to a bus line intended to carry an inverted signal is set to "1".

In addition, the format analysis unit 151a updates "V" of the packet control register 112a to "0" when detecting the end of the bus control packet.

The format analysis unit 151a further updates the copy register 152 with the "E" and "R" values extracted from the first half of the bus control packet. This copy register 152 keeps these values for one clock cycle for reference in the operation of the format analysis unit 151a.

The detailed operation of the packet analysis circuit 150a will be described with reference to FIG. 16 later.

The bus inversion circuit 160a inverts and outputs the polarity of a signal of a specified bus line in a signal received from the bus arbitration circuit 120, according to the bus inversion signal received from the packet analysis circuit 150a. The bus inversion circuit 160a includes a bus inversion data register 161a and an inverting gate 162a.

The bus inversion data register 161a keeps the values of the bits of the bus inversion signal received from the bus analysis circuit 150a. The bits of the bus inversion data register 161a correspond to the respective bus lines connecting the bus arbitration circuit 120 and the inverting gate 162a.

The inverting gate 162a is a gate circuit that performs the EOR operation of a signal of each bus line from the bus arbitration circuit 120 and the value of a corresponding bit of the bus inversion data register 161a. The inverting gate 162a inverts and outputs the polarity of a signal received from the bus line corresponding to a bit of "1" of the bus inversion data register 161a.

The bus inversion circuit 160a also outputs a select signal for controlling switching of the selector 141 among input channels. In the case where the bus inversion data register 161a has all bits of either "0" or "1", "1" is output as the select signal.

The output circuit 130 includes an output register 131 for storing a signal received from the inverting gate 162a of the bus inversion circuit 160a in the output register 131 once and then outputting the signal to the connection bus 300.

The selector 141 receives a signal from the bus arbitration circuit 120 and a signal from the inverting gate 162a of the bus inversion circuit 160a, and selectively outputs a signal to the error detection circuit 140. More specifically, in response to the select signal of "0" from the bus inversion circuit 160a, the selector 141 selects the signal received from the inverting gate 162a. In response to the select signal of "1", the selector 141 selects the signal received from the bus arbitration circuit 120.

According to this switching operation, in a situation where the inverting gate 162a of the bus inversion circuit 160a switches its operation between enabling and disabling the signal inversion on all bus lines, a signal output from the bus arbitration circuit 120 is input to the error detection circuit 140. In this case, the error detection is performed based on a packet before the packet is inverted by the inverting gate 162a.

On the other hand, in a situation where the inverting gate 162a switches its operation between enabling and disabling the signal inversion on partial bus lines, a signal output from the inverting gate 162a is input to the error detection circuit 140. In this situation, it becomes possible to, for example, cause the inverting gate 162a to invert only a signal of a desired bus line and supply the packet to the error detection circuit 140 so as to detect whether an error has occurred in the bus located on the input side of the inverting gate 162a.

The error detection circuit 140 performs error detection for up to two bits based on the values of the input signal selected by the selector 141. When an error is detected, the error detection circuit 140 notifies the CPU 101 of the information processing apparatus 100a of the error in order to stop the communication between the bus controller 105 and the bus I/F 104a.

The error detection circuit 140 may be designed to perform error correction when a single-bit error is detected. When error correction is performed based on the signal output from the bus arbitration circuit 120, the error detection circuit 140 outputs the error-corrected signal to the packet analysis circuit 150a and bus inversion circuit 160a. On the other hand, when the error correction is performed based on the signal output from the bus inversion circuit 160a, the error detection circuit 140 places the error-corrected signal into the output register 131 of the output circuit 130.

By the way, the bus I/F 204a of the information processing apparatus 200a may be provided with the above-described functions of the bus I/F 104a illustrated in the FIG. 14.

Figure 16:
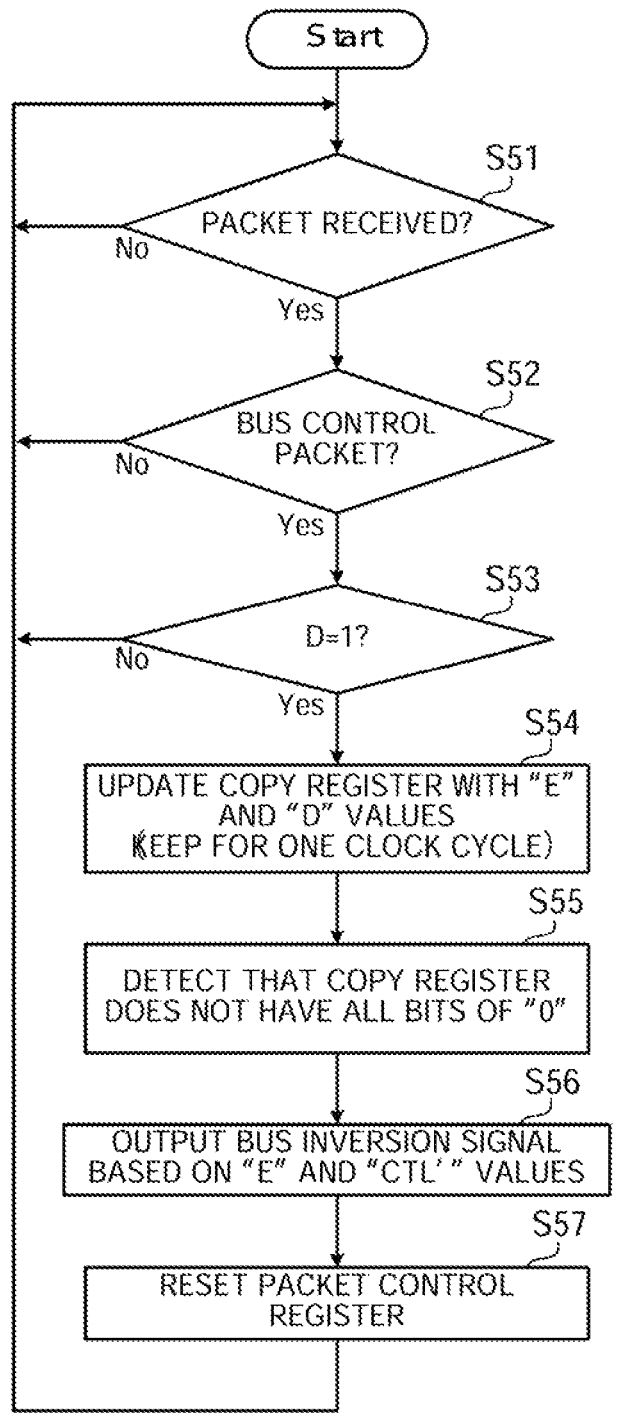
FIG. 16 is a flowchart of how a packet analysis circuit operates.

FIG. 16 is a flowchart of how a packet analysis circuit operates.

(Step S51) The format analysis unit 151a of the packet analysis circuit 150a waits for a packet to be output from the bus arbitration circuit 120, and when receiving a packet, proceeds to next step S52.

(Step S52) The format analysis unit 151a analyzes the received packet to determine whether the received packet is a bus control packet or not. If the received packet has "TAG" of "01" and "CODE" of "FF", the format analysis unit 151a determines that the first half of the bus control packet has been received, and proceeds to step S53. If the received packet is not a bus control packet, on the contrary, the format analysis unit 151a returns back to step S51.

(Step S53) The format analysis unit 151a extracts the "D" value from the received bus control packet. If "D" is "1", then the format analysis unit 151a proceeds to step S54. If "D" is "0", on the other hand, the format analysis unit 151a returns back to step S51.

(Step S54) The format analysis unit 151a updates the copy register 152 with the "E" and "D" values of the received bus control packet. The copy register 152 autonomously keeps the stored vales for one clock cycle, for example. In this connection, for example, it may be designed that the stored values of the copy register 152 are cleared by the format analysis unit 151a after step S57 is executed.

(Step S55) The format analysis unit 151a consults the copy register 152 in the clock cycle next to the one in which the packet reception was started at step S51, that is, in the clock cycle where the second half of the bus control packet is received. If the copy register 152 does not have all bits of "0", then the format analysis unit 151a determines that the signal currently received is the end of the bus control packet. In this example, if the copy register 152 stores at least "D" of "1", it is determined that the currently received signal is the end of the bus control packet.

Alternatively, receipt of the end of a bus control packet may be judged based on the "LNG" value of the bus control packet. For example, when the format analysis unit 151a determines that the first half of the bus control packet was received at step S52, then it starts to count the clock cycles, and when the count value reaches the "LNG" value, determines that the end of the bus control packet has been received.

(Step S56) The format analysis unit 151a outputs the bus inversion signal to the bus inversion circuit 160a based on the "E" value stored in the copy register 152 and the "CTL'" value that was extracted from the second half of the bus control packet after step S55. The stored values of the bus inversion data register 161a are updated based on the output bus inversion signal.

For example, if "E" is "1x", all bits of the bus inversion signal are set to either "0" or "1" according to the "CTL'" value. If "E" is "00", then a bit specified for signal inversion by the "CTL'" value out of the bits of the bus inversion signal corresponding to the data bus lines is set to "1". If "E" is "01", then a bit specified for signal inversion by the "CTL'" value out of the bits of the bus inversion signal corresponding to the bus lines for "TAG" and "ECC" is set to "1".

In this connection, by setting all bits of "CTL'" to "0", irrespective that "E" has any value, all bits of the bus inversion signal are set to "0", which causes the inverting gate 162a to disable the signal inversion operation. In short, a bus control packet having "D" of "1" and all bits of "0" in "CTL'" instructs the transmitting side to disable the signal inversion operation.

(Step S57) The format analysis unit 151a updates "V" of the packet control register 121a to "0", and then returns back to step S51 to wait for a next packet.

Figure 17:
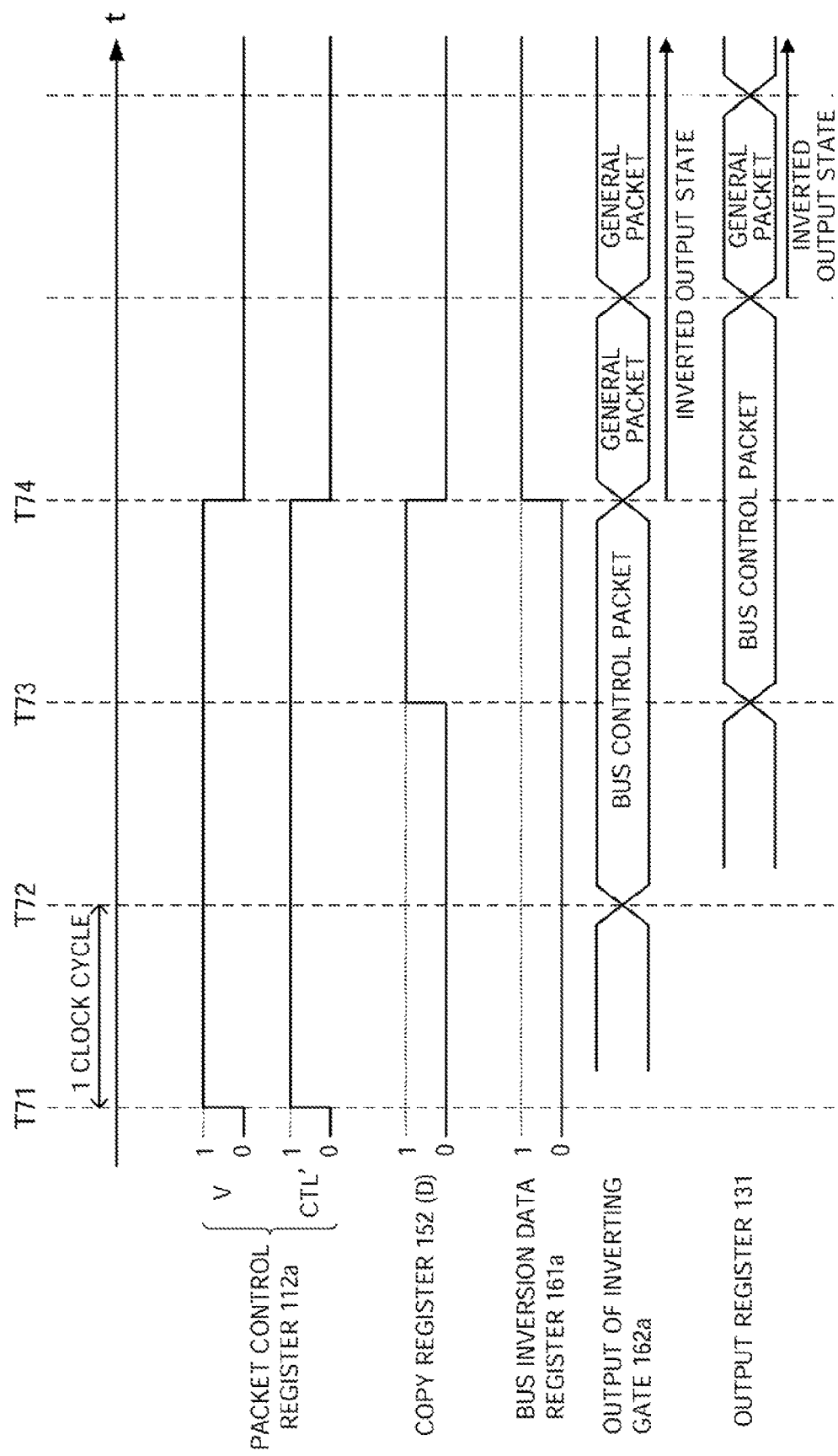
FIG. 17 is a time chart illustrating an example operation of the transmitting-side bus I/F.

FIG. 17 is a time chart illustrating an example operation of a transmitting-side bus I/F.

It is assumed that the inverting gate 162a of the bus inversion circuit 160a does not perform inversion on any bus lines immediately before timing T71 of FIG. 17. That is, the bus inversion data register 161a has all bits of "0".

In this situation, the register setting unit 111a sets "V" to "1" and "E" and "CTL'" to desired values in the packet control register 112a (timing T71). In this example, it is assumed that "D" of the packet control register 112a is set to "1".

When detecting that "V" of the packet control register 112a turns to "1", the format conversion unit 113a generates a bus control packet, and requests the bus arbitration circuit 120 to transmit the bus control packet. At this time, "CTL'" of the generated bus control packet is set to have the same value as "CTL'" of the packet control register 112a.

Upon receipt of the transmission request from the format conversion unit 113a, the bus arbitration circuit 120 outputs the bus control packet from the format conversion unit 113a to the selector 141, packet analysis circuit 150a, and bus inversion circuit 160a (timing T72). In this embodiment, the bus control packet is output in two clock cycles (timing T72 to T74).

The format analysis unit 151a of the packet analysis circuit 150a extracts the "E" and "D" values from the received first half of the bus control packet, and updates the copy register 152 with these values (timing T73). These stored values of the copy register 152 are kept for one clock cycle (timing T73 to T74).

When the second half of the bus control packet is received, the copy register 152 has at least "D" of "1". Therefore, the format analysis unit 151a determines that the end of the bus control packet has been received. Then, the format analysis unit 151a outputs a bus inversion signal based on the "CTL'" value extracted from the second half of the received bus control packet and the "E" value stored in the copy register 152. Thereby, the bus inversion data register 161a is updated with the values of this bus inversion signal (timing T74). FIG. 17 illustrates that one bit specified for the inversion in the bus inversion data register 161a is changed from "0" to "1".

At this time, the format analysis unit 151a updates "V" of the packet control register 112a to "0".

Until the second half of the bus control packet is output from the inverting gate 162a (timing T72 and T73), the bus inversion data register 161a has all bits of "0". Therefore, the bus control packet is output to the output circuit 130 as it is, without any bits inverted. When the bus inversion data register 161a is updated, the inverting gate 162a inverts and outputs a signal of a bus line corresponding to the bit of "1" of the bus inversion data register 161a (timing T74). That is, in a signal of packets following the bus control packet, only a signal to be sent to the bus line intended to carry an inverted signal is inverted.

In the above-described bus I/F 104a, when a bus control packet for switching the signal inversion operation of the inverting gate 162a is output from the bus arbitration circuit 120, the bus inversion data register 161a is updated after the bus control packet passes through the inverting gate 162a. Therefore, the inverting gate 162a switches its operation according to the bus control packet after the bus control packet passes through the inverting gate 162a.

Figure 18:
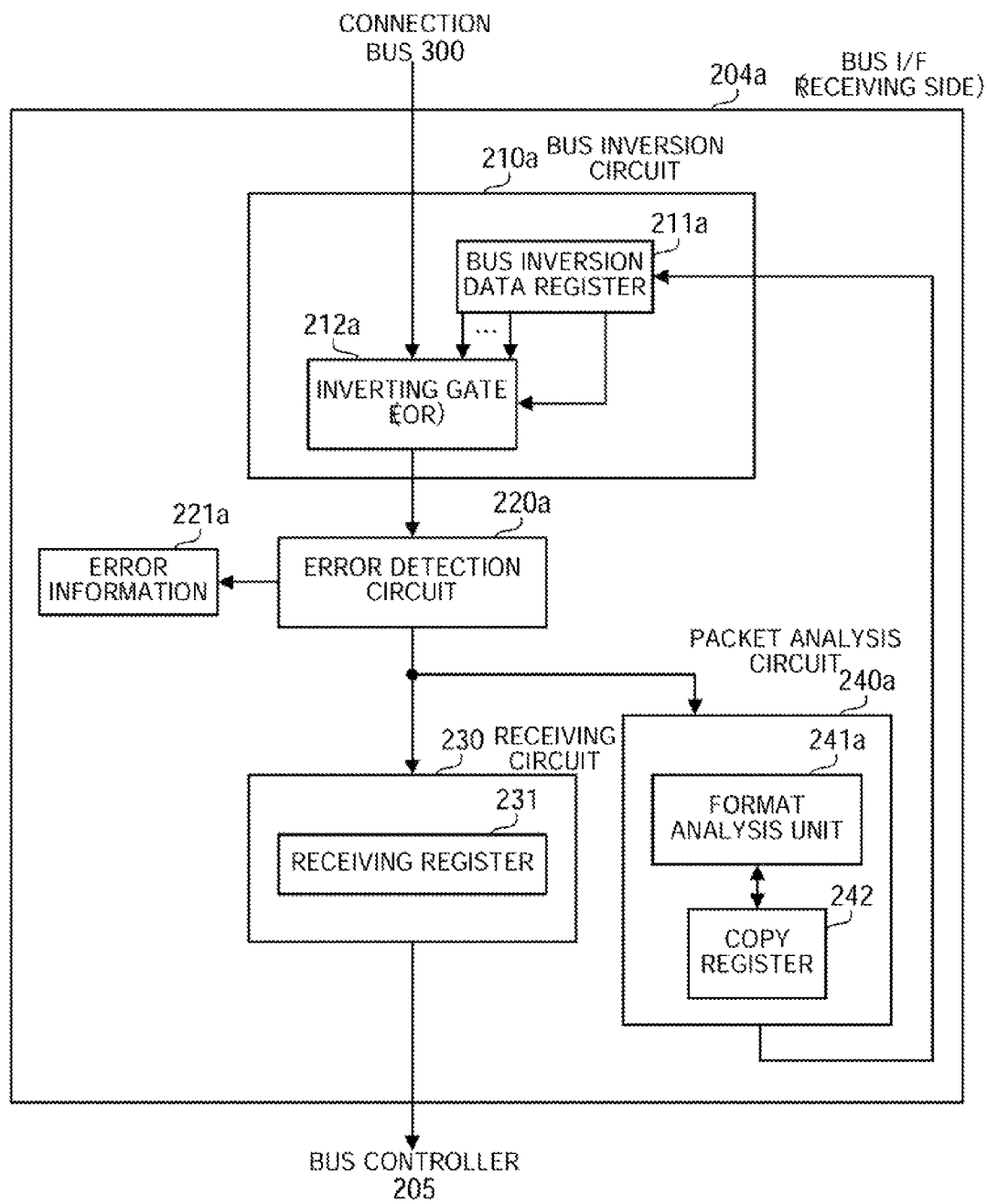
FIG. 18 illustrates an internal configuration of a receiving-side bus I/F.

FIG. 18 illustrates an internal configuration of the receiving-side bus I/F. The same reference numerals are used in FIG. 18 as in FIG. 9 for corresponding components.

The bus I/F 204a of the information processing apparatus 200a includes a bus inversion circuit 210a, an error detection circuit 220a, a receiving circuit 230, and a packet analysis circuit 240a.

The bus inversion circuit 210a inverts the polarity of a signal received from a bus line specified by a bus control packet, in a signal received from the connection bus 300, according to a bus inversion signal received from the packet analysis circuit 240a. The bus inversion circuit 210a includes a bus inversion data register 211a and an inverting gate 212a.

The bus inversion data register 211a and inverting gate 212a have the same configuration as the bus inversion data register 161a and inverting gate 162a, respectively. That is, the bus inversion data register 211a has as many bits as there are the bus lines of the connection bus 300, in order to store the values of a bus inversion signal output from the packet analysis circuit 240a. The inverting gate 212a is a gate circuit that performs the EOR operation of the signal on each bus line of the connection bus 300 and the value of a corresponding bit of the bus inversion data register 211a. The inverting gate 212a inverts and outputs the polarity of a signal received from a bus line corresponding to a bit of "1" of the bus inversion data register 211a.

The error detection circuit 220a performs error detection for up to two bits based on a signal received from the inverting gate 212a, that is, "TAG" value, values on data bus lines, and "ECC" value. In addition, when a single-bit error is detected, the error detection circuit 220a performs error correction.

When an error is detected, the error detection circuit 220a also generates error information 221a describing the error. More specifically, this error information 221a includes data which was stored in the bus inversion data register 211a when the error was detected. This makes it possible to identify which bus line carried an inverted signal when the error was detected. In this connection, the error information 211a is stored in a non-volatile memory medium such as the HDD 203, for example. In addition, the contents of the error information 221a may be provided to an administrator via a display device (not illustrated) or another device connected to the information processing apparatus 200a, for example.

The receiving circuit 230 includes a receiving register 231 for storing a signal of one clock cycle received from the error detection circuit 220a in the receiving register 231 once and then outputting it to the bus controller 205 of the information processing apparatus 200a.

The packet analysis circuit 240a controls the signal inversion operation of the bus inversion circuit 210a according to the contents of the packet received from the error detection circuit 220a. The packet analysis circuit 240a includes a format analysis unit 241a for analyzing the packet, and a copy register 242 for temporarily storing data extracted from a bus control packet.

Upon receipt of a bus control packet having "R" of "1" from the error detection circuit 220a, the format analysis unit 241a outputs a bus inversion signal specifying which bus line is intended to carry an inverted signal, to the bus inversion circuit 210a, on the basis of the "E" and "CTL'" values. Similarly to the bus inversion signal that is used by the transmitting-side bus I/F 204a, the bus inversion signal has as many bits as there are the bus lines of the connection bus 300, and the bits of the bus inversion signal correspond to the respective bus lines. Then, a bit corresponding to a bus line intended to carry an inverted signal is set to "1".

The format analysis unit 241a also updates the copy register 242 with the "E" and "R" values extracted from the first half of the bus control packet. These stored values of the copy register 242 are kept for one clock cycle for reference in the operation of the format analysis unit 241a. The detailed operation of the packet analysis unit 241a based on the values of the copy register 242 will be described with reference to FIG. 19 later.

The receiving circuit 230 may be arranged on the input side of the bus inversion circuit 210a, for example, as long as the error detection circuit 220a is capable of performing error detection and error correction based on an output signal of the bus inversion circuit 210a.

Further, the bus I/F 104a of the information processing apparatus 100a may be provided with the above-described functions of the bus I/F 204a illustrated in FIG. 18.

Figure 19:
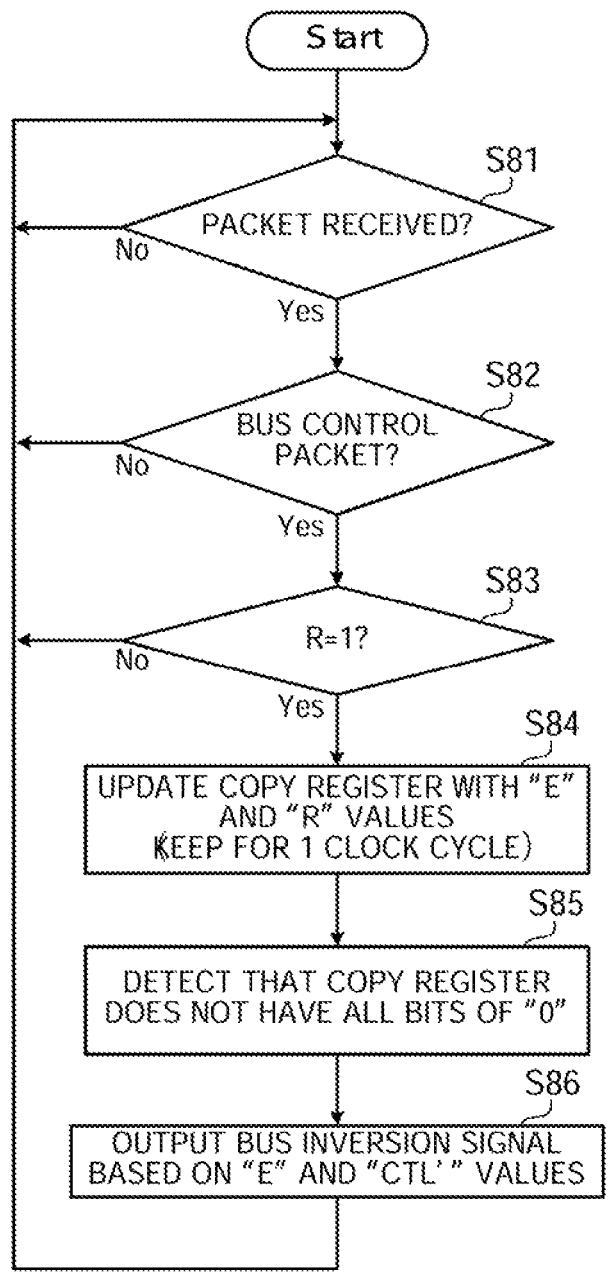
FIG. 19 is a flowchart of how a packet analysis circuit operates.

FIG. 19 is a flowchart of how a packet analysis circuit operates.

(Step S81) The format analysis unit 241a of the packet analysis circuit 240a waits for a packet to be output from the error detection circuit 220a, and when receiving a packet, proceeds to next step S82.

(Step S82) The format analysis unit 241a analyzes the received packet to determine whether the received packet is a bus control packet or not. If the received packet has "TAG" of "01" and "CODE" of "FF", the format analysis unit 241a determines that the first half of a bus control packet has been received, and proceeds to step S83. If the received packet is not a bus control packet, then the format analysis unit 241a returns back to step S81.

(Step S83) The format analysis unit 241a extracts "R" value from the received bus control packet. If "R" is "1", the format analysis unit 241a proceeds to step S84. If "R" is "0", on the other hand, the format analysis unit 241a returns back to step S81.

(Step S84) The format analysis unit 241a updates the copy register 242 with the "E" and "R" values of the received bus control packet. The copy register 242 autonomously keeps the stored values for one clock cycle, for example. In this connection, it may be designed that these stored values of the copy register 242 are cleared by the format analysis unit 241a after step S86 is executed.

(Step S85) The format analysis unit 241a consults the copy register 242 in the clock cycle next to the one in which the packet reception was started at step S81, that is, in the clock cycle in which the second half of the bus control packet is received. At this time, when detecting that the copy register 242 does not have all bits of "0", the format analysis unit 241a determines that the currently received signal is the end of the bus control packet. For example, if the copy register 242 stores at least "R" of "1", the currently received signal is determined as the end of the bus control packet.

Similarly to the transmitting-side apparatus, receipt of the end of a bus control packet may be judged based on the "LNG" value of the bus control packet, for example.

(Step S86) The format analysis unit 241a outputs a bus inversion signal to the bus inversion circuit 210a based on the "E" value stored in the copy register 242 and the "CTL'" value extracted from the second half of the bus control packet. Thereby, the stored values of the bus inversion data register 211a are updated based on this bus inversion signal.

In the case of "E" of "1x", for example, all bits of the bus inversion signal are set to either "0" or "1" according to the "CTL'" value. In the case of "E" of "00", a bit specified for signal inversion by the "CTL'" value is set to "1" out of the bits of the bus inversion signal corresponding to the data bus lines. In the case of "E" of "01", a bit specified for signal inversion by the "CTL'" value is set to "1" out of the bits of the bus inversion signal corresponding to the bus lines for "TAG" and "ECC".

By setting all bits of the bus inversion signal to "0", irrespective that "E" has any value, the signal inversion operation of the inverting gate 212a is disabled. That is to say, a bus control packet having "R" of "1" and all bits of "0" in "CTL'" is a packet that causes the receiving-side apparatus to disable its signal inversion operation.

Then, the format analysis unit 241a returns back to step S81 to wait for a next packet.

Figure 20:
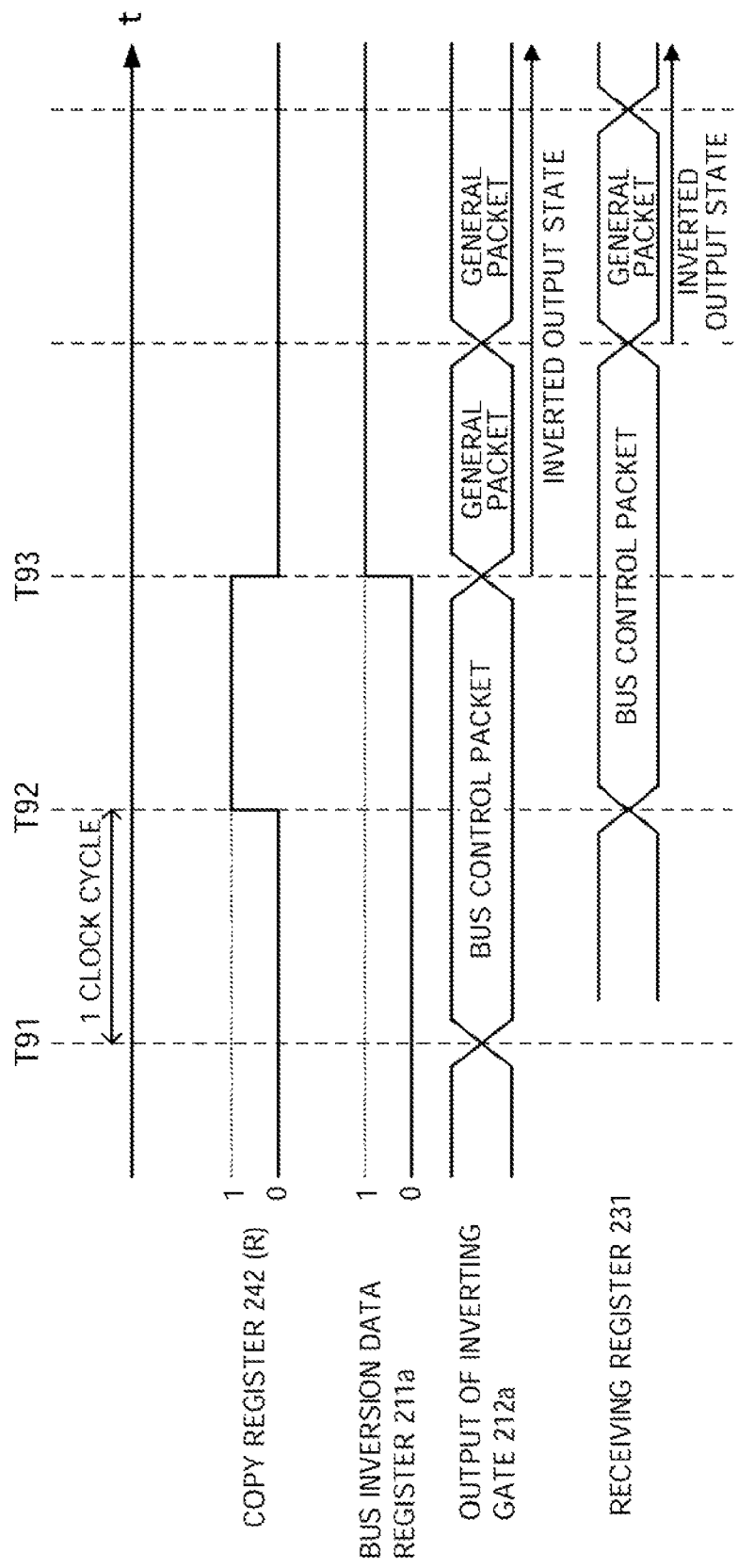
FIG. 20 is a time chart illustrating an example operation of the receiving-side bus I/F.
Figure 21:
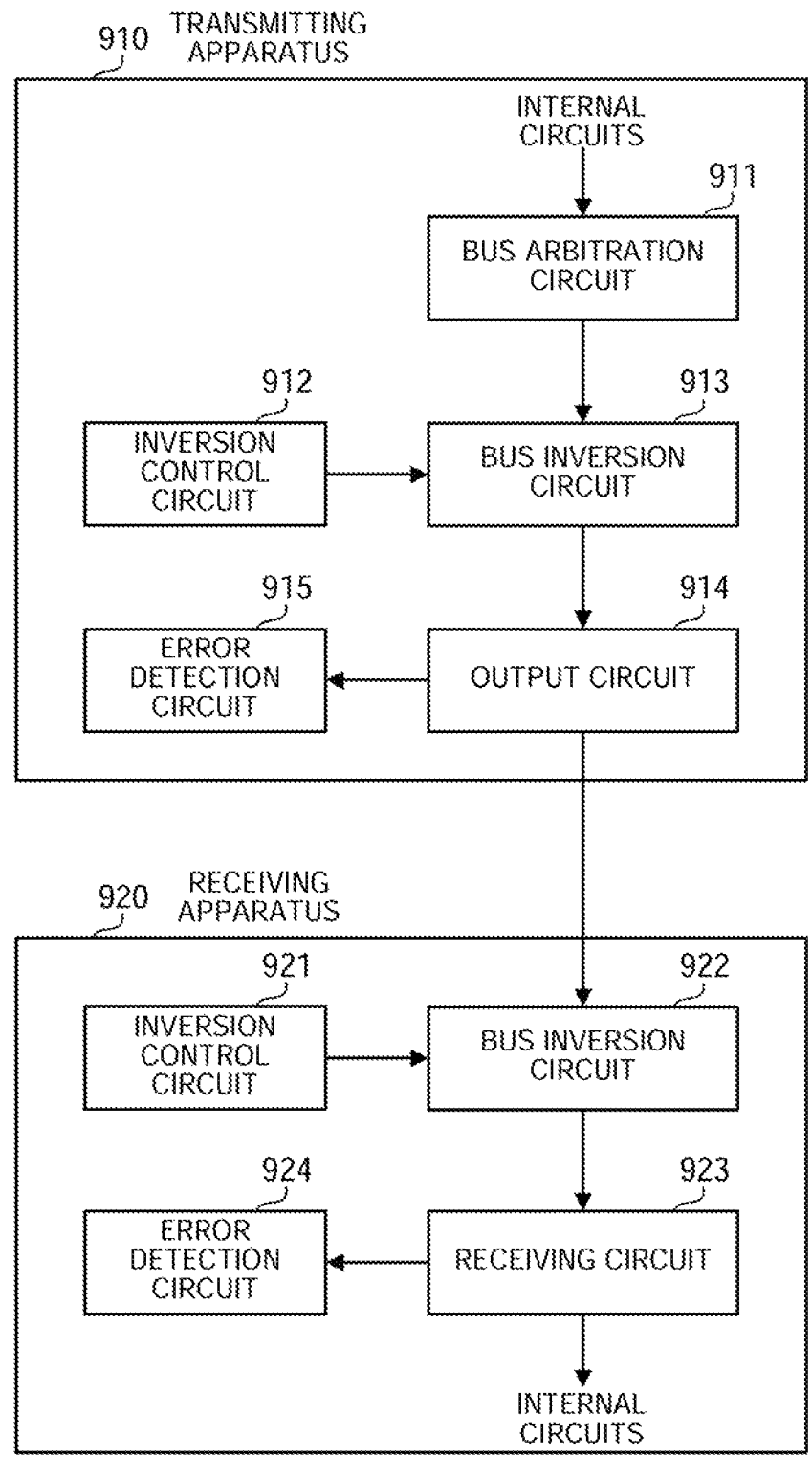
FIG. 21 illustrates an example configuration of information processing apparatuses provided with a bus error checking function.

FIG. 20 is a time chart illustrating an example operation of a receiving-side bus I/F.

It is assumed that, immediately before timing T91, a signal transmitted over any bus lines of the connection bus 300 is not an inverted version of an original signal, and the inverting gate 212a of the bus inversion circuit 210a does not perform inversion on any bus lines. At this time, the bus inversion data register 211a has all bits of "0".

When the first half of a bus control packet is received from the connection bus 300 in this situation, the first half of this bus control packet passes through the inverting gate 212 and error detection circuit 220a and enters the receiving circuit 230 and packet analysis circuit 240a (timing T91).

It is now assumed that the received first half of the bus control packet has "R" of "1". In addition, as described earlier, the bus control packet is transmitted in two clock cycles. The format analysis unit 241a of the packet analysis circuit 240a extracts the "E" and "R" values from the received first half of the bus control packet, and updates the copy register 242 with these values (timing T92). The stored values of the copy register 242 are kept for one clock cycle (timing T92 to T93).

When the second half of the bus control packet is received from the error detection circuit 220a, the copy register 242 has at least "R" of "1". Therefore, the format analysis unit 241a determines that the end of the bus control packet has been received. Then, the format analysis unit 241a outputs a bus inversion signal based on the CTL'" value extracted from the received second half of the bus control packet and the "E" value stored in the copy register 242. Thereby, the bus inversion data register 211a is updated with the values of this bus inversion signal (timing T93). FIG. 20 illustrates a change of a bit specified for inversion from "0" to "1" in the bus inversion data register 211a at timing T93.

Until the second half of the bus control packet is output from the inverting gate 212a (timing T91 and T92), the bus control data register 211a has all bits of "0". Therefore, the bus control packet is output to the error detection circuit 220a as it is, without any bits inverted. When the bus inversion data register 211a is updated, the inverting gate 212a inverts a signal of a bus line corresponding to a bit of "1" of the bus inversion data register 211a, and outputs the signal (timing T93). As a result, in a signal of packets following the bus control packet, a signal of a bus line specified for inversion is inverted by the inverting gate 212a.

In the above-described bus I/F 204a, when a bus control packet for switching of the signal inversion operation of the inverting gate 212a is received, the bus inversion data register 211a is updated after the bus control packet passes through the inverting gate 212a. Therefore, the inverting gate 212a switches its operation as instructed by the bus control packet after the bus control packet passes through the inverting gate 212a.

The above-described information transmission system of the third embodiment is capable of performing the bus error check in the following three patterns.

The first pattern is the case where a bus control packet has "E" of "1x" and "D" and R" of "1". In this case, by setting all bits of "CTL'" of the bus control packet to "1", the inverting gate 162a of the transmitting-side bus I/F 104a inverts a signal to be sent to all bus lines, after receiving the bus control packet. The inverting gate 212a of the receiving-side bus I/F 204a inverts the signal on all bus lines after receiving the bus control packet to restore its polarity back to the original state. The signal inverted by the inverting gate 212a is input to the error detection circuit 220a and is used to check whether an error has occurred in the bus lines of the connection bus 300.

In addition, by outputting a bus control packet with "CTL" having all bits of "0" after the signal inversion on all bus lines starts, for example, the inverting gate 162a of the transmitting-side bus I/F 104a disables the signal inversion operation on all bus lines after outputting the bus control packet. In addition, the inverting gate 212a of the receiving-side bus I/F 204a also disables the signal inversion operation on all bus lines after outputting the bus control packet.

In short, in this first pattern, the same bus error check as in the second embodiment is performed. If one bus line has failed, the receiving-side error detection circuit 220a detects a single-bit error and executes the error correction through this bus error check, but does not detect a two- or more-bit error which is uncorrectable. As a result, it is possible to detect an error in one bus line of the connection bus 300 while the normal signal transmission takes place.

The second pattern is the case where a bus control packet has "E" of "00" or "01", "D" of "0", and "R" of "1". In this case, the inverting gate 162a of the transmitting-side bus I/F 104a does not perform the signal inversion but the inverting gate 212a of the receiving-side bus I/F 204a performs the signal inversion.

Then, for example, by setting only one bit out of the bits of "CTL" of the bus control packet to "1", the receiving-side bus I/F 204a is caused to invert only a signal of one bus line specified by the "CTL" in a received signal. Then, if the error detection circuit 220a detects an error in the inverted bit of the bus line, this bus line is determined to be normal. If the error detection circuit 220a does not detect any errors or detects a double-bit error, the bus line carrying the inverted signal is determined to have failed.

The third pattern is the case where a bus control packet has "E" of "00" or "01", "D" of "1", and "R" of "0". In this case, only the inverting gate 162a of the transmitting-side bus I/F 104a performs the signal inversion but the inverting gate 212a of the receiving-side bus I/F 204a does not perform the signal inversion.

Then, for example, by setting only one bit out of the bits of "CTL" of the bus control packet to "1", only a signal to be sent to a bus line specified by the "CTL" is inverted in a signal to be sent to the connection bus 300. In the receiving-side bus I/F 204a, if the error detection circuit 220a detects an error in the bus line carrying the inverted signal, the bus line is determined to be normal. If the error detection circuit 220a does not detect any errors or detects a double-bit error, the bus line carrying the inverted signal is determined to have failed.

In addition, in the transmitting-side bus I/F 104a, the error detection circuit 140 performs error detection based on an output signal of the inverting gate 162a, thereby making it possible to detect an error occurring in the bus located on the input side of the inverting gate 162a. In order to perform the error check on the bus located on the input side of the inverting gate 162a, "R" of the bus control packet may be set to either "0" or "1".

In the above second and third patterns, a double-bit error is detected if a bus line other than one carrying an inverted signal has failed. Therefore, it is desirable that the bus error check is performed outside the normal operation time.

Further, the above second and third patterns invert a bit only on one bus line. However, this embodiment makes it possible to invert bits on two or more bus lines.

As another pattern, it may be possible to cause both the transmitting-side apparatus and the receiving-side apparatus to invert the same bit on a bus line so as to determine at the receiving-side apparatus whether the bus line carrying the inverted bit has failed. In this connection, it is desirable that the error check in this pattern is performed outside the normal operation time because the receiving-side apparatus may detect a two- or more-bit error.

As described above, this embodiment makes it possible to perform not only the same bus error check as in the second embodiment but also to perform the bus error check in various patterns by specifying which bus line is intended to carry an inverted signal or which signal is to be inverted.

The above-described second and third embodiments describe the error check on a bus connecting information processing apparatuses. However, it may be designed so that the transmitting-side bus I/F and receiving-side bus I/F of the above embodiments are provided in one information processing apparatus, and the error check is performed on a bus connecting internal devices of this information processing apparatus.

The above information processing apparatus makes it possible to perform the error check on a parallel bus while the normal information transmission takes place.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. An information processing apparatus that transmits signals including transmit data and an error-correcting code generated based on the transmit data to a receiving-side device in parallel via a parallel bus having plural bus lines, the information processing apparatus comprising:
   a signal inversion unit that inverts at least portion of the signals to be sent to the receiving-side device through bus lines of the parallel bus; and
   a command output unit to output, to the parallel bus, an inversion command for instructing the receiving-side device to invert a received signal from the bus line of the parallel bus, and an error-correcting code generated based on the inversion command,
   wherein the signal inversion unit inverts the signal to be sent to the parallel bus after the inversion command is output to the parallel bus.

2. The information processing apparatus according to claim 1, wherein:
   the command output unit generates the inversion command and the error-correcting code based on the inversion command, and sends the generated inversion command and the generated error-correcting code to the parallel bus via the signal inversion unit; and
   the information processing apparatus further comprises an inversion control unit to cause the signal inversion unit to start to invert the signal to be sent to the parallel bus when the inversion control unit detects the inversion command from an input signal.

3. The information processing apparatus according to claim 2, wherein:
the command output unit generates an inversion disable command for instructing the receiving-side device to disable inversion of the received signal, and an error-correcting code based on the inversion disable command, and sends the generated inversion disable command and the generated error-correcting code to the parallel bus via the signal inversion unit; and
the inversion control unit causes the signal inversion unit to disable the inversion of the signal to be sent to the parallel bus when the inversion control unit detects the inversion disable command from the input signal.

4. The information processing apparatus according to claim 2, wherein:
the command output unit generates a partial inversion command including bus designation data specifying a bus line in which inverted signal is transmitted and execution device designation data specifying a device, out of a receiving-side device and a transmitting-side device, which inverts the signal to be transmitted through the specified bus line specified by the bus designation data, and an error-correcting code generated based on the partial inversion command, and sends the generated partial inversion command and the generated error-correcting code to the parallel bus via the signal inversion unit; and
the inversion control unit causes the signal inversion unit to invert a signal to be sent to the specified bus line when the inversion control unit detects the partial inversion command from the input signal.

5. An information processing apparatus, comprising:
a signal inversion unit, connected to a parallel bus that carries transmit data and an error-correcting code based on the transmit data in parallel, to invert a signal received from the parallel bus;
an error detection unit to perform error detection and error correction based on a signal received by the signal inversion unit; and
an inversion control unit to cause, upon receipt of an inversion command for instructing inversion of the signal received from the parallel bus via the signal inversion unit, the signal inversion unit to start to invert the signal received from the parallel bus after the inversion command is output from the signal inversion unit.

6. The information processing apparatus according to claim 5, wherein:
the inversion control unit causes, upon receipt of an inversion disable command for disabling the inversion of the signal received from the parallel bus via the signal inversion unit, the signal inversion unit to disable the inversion of the signal received from the parallel bus after the inversion disable command is output from the signal inversion unit.

7. The information processing apparatus according to claim 5, wherein:
the inversion control unit causes, upon receipt of a partial inversion command for instructing inversion of a signal received from a specified bus line of the parallel bus via the signal inversion unit, the signal inversion unit to invert the signal received from the specified bus line specified by the partial inversion command after the partial inversion command is output from the signal inversion unit.

8. The information processing apparatus according to claim 7, wherein:
the partial inversion command includes execution device designation data specifying which one of a transmitting side and a receiving side inverts the signal transmitted through the specified bus line; and
the inversion control unit causes, upon receipt of the partial inversion command, which includes the execution device designation data specifying the receiving side, the signal inversion unit to invert the signal received from the specified bus line specified by the partial inversion command.

9. An information transmitting method for transmitting data between a transmitting-side device and a receiving-side device connected by a parallel bus including plural bus lines, the method comprising:
inverting a signal transmitted from the transmitting-side device to the receiving-side device through the parallel bus; and
performing error detection and error correction of the received data by the transmitting-side device,
wherein the receiving-side device inverts the signal received through the parallel bus, and performs the error detection and the error correction of the signal including the inverted signal.

10. The information transmitting method according to claim 9, wherein:
the transmitting-side device inverts the signal to be sent to the receiving-side device, and sends the inverted signal to the receiving-side device through the parallel bus, and
the receiving-side device receives the inverted signal, and performs the error correction of the received data.

11. The information processing method according to claim 9, further comprising:
outputting an inversion command for instructing the receiving-side device to invert a received signal from the bus line of the parallel bus from the transmitting-side device, and an error-correcting code based on the inversion command to the parallel bus; and
inverting the signal to be sent to the bus lines of the parallel bus after the inversion command is output to the parallel bus.

12. An information receiving method for receiving data transmitted from a transmitting-side device by a parallel bus including plural bus lines, the method comprising:
inverting a signal received from bus lines of the parallel bus;
performing error detection and error correction based on the inverted signal;
receiving, from the parallel bus, an inversion command for instructing inversion of the signal received from the bus lines of the parallel bus; and
inverting the signal received from the bus lines after the inversion command is received.

* * * * *